United States Patent
Kagan

(10) Patent No.: US 7,366,029 B2
(45) Date of Patent: Apr. 29, 2008

(54) HIGH-PERFORMANCE FLASH MEMORY DATA TRANSFER

(75) Inventor: Yishai Kagan, Sunnyvale, CA (US)

(73) Assignee: SanDisk Corporation, Milpitas, CA (US)

(*) Notice: Subject to any disclaimer, the term of this patent is extended or adjusted under 35 U.S.C. 154(b) by 46 days.

(21) Appl. No.: 11/424,581

(22) Filed: Jun. 16, 2006

(65) Prior Publication Data

US 2007/0247934 A1    Oct. 25, 2007

Related U.S. Application Data

(63) Continuation-in-part of application No. 11/379,910, filed on Apr. 24, 2006, and a continuation-in-part of application No. 11/379,895, filed on Apr. 24, 2006, now Pat. No. 7,345,926.

(51) Int. Cl.
   *G11C 11/34* (2006.01)
(52) U.S. Cl. .............................. 365/185.33; 365/185.11
(58) Field of Classification Search ........... 365/185.33, 365/185.04, 185.11
See application file for complete search history.

(56) References Cited

U.S. PATENT DOCUMENTS

| | | | |
|---|---|---|---|
| 5,172,338 A | 12/1992 | Mehrotra et al. | |
| 5,581,503 A * | 12/1996 | Matsubara et al. | .... 365/185.33 |
| 6,060,916 A | 5/2000 | Park | |
| 6,094,375 A | 7/2000 | Lee | |
| 6,266,273 B1 * | 7/2001 | Conley et al. | ......... 365/185.11 |
| 6,335,901 B1 | 1/2002 | Morita et al. | |
| 6,621,496 B1 | 9/2003 | Ryan | |
| 6,747,892 B2 | 6/2004 | Khalid | |
| 2003/0031076 A1 | 2/2003 | Widmer et al. | |
| 2003/0043624 A1 | 3/2003 | Roohparvar et al. | |
| 2004/0215996 A1 | 10/2004 | Kanamori et al. | |
| 2005/0207231 A1 * | 9/2005 | Kim | ...................... 365/185.33 |

(Continued)

FOREIGN PATENT DOCUMENTS

WO    95/34030 A2    12/1995

OTHER PUBLICATIONS

"128Mbit DDR SDRAM", Datasheet K4D261638E, Rev. 1.2 (Samsung, Jul. 2003).

(Continued)

*Primary Examiner*—Anh Phung
(74) *Attorney, Agent, or Firm*—Anderson, Levine & Lintel

(57) ABSTRACT

A flash memory system including a flash memory device and a controller, operable according to an advanced data transfer mode is disclosed. The flash memory device is operable both in a "legacy" mode, in which read data is presented by the memory synchronously with each cycle of a read data strobe from the controller, and in which input data is latched by the memory synchronously with each cycle of a write data strobe from the controller. In the advanced mode, which can be initiated by the controller forwarding an initiation command to the memory, the flash memory itself sources the read data strobe at a higher frequency, for example at twice the frequency, of that available in the normal mode. In the advanced mode, the input data is presented by the controller synchronously with a higher frequency write data strobe than is available in the normal mode. The voltage swing of the data and control signals is reduced from conventional standards, to reduce power consumption.

24 Claims, 16 Drawing Sheets

U.S. PATENT DOCUMENTS

2005/0270891 A1    12/2005    Flach et al.

OTHER PUBLICATIONS

"x32 DDR SDRAM: Device Operation and Timing Diagram" (Samsung).
"DDR SDRAM DIM: MT4VDDT864A -64MB; MT4VDDT1664A—128MB; MT4VDDT3264A—256MB" (Micron Technology, Inc., 2004).
"CF+ and CompactFlash Specification Revision 3.0" (CompactFlash Association, 2004).
Yoo, "High-Speed DRAM Interface", Potentials, vol. 20, No. 5 (IEEE, 2001), pp. 33-34.
Nakagome et al., "Sub-1-V Swing Internal Bus Architecture for Future Low-Power ULSI's", J. Solid State Circ., vol. 28, No. 4 (IEEE, 1993), pp. 414-419.
Lee et al., "A 1 Gbit Synchronous Dynamic Random Access Memory with an Independent Subarray-Controlled Scheme and a Hierarchical Decoding Scheme", J. Solid State Circ., vol. 33, No. 5, (IEEE, 1998), pp. 779-785.
Ikeda et al., "High-Speed DRAM Architecture Development", J. Solid State Circ., vol. 34, No. 5 (IEEE, 1999), pp. 685-692.
Kirihata et al., "A 390-mm2, 16-Bank, 1-Gb DDR SDRAM with Hybrid Bitline Architecture", J. Solid State Circ., vol. 34, No. 11 (IEEE, 1999), pp. 1580-1588.
Yoon et al., "A 2.5-V, 333-Mb/s/pin, 1-Gbit, Double-Data-Rate Synchronous DRAM", J. Solid State Circ., vol. 34, No. 11 (IEEE, 1999), pp. 1589-1599.
Pilo et al., "An 833-MHz 1.5-W 18-Mb CMOS SRAM with 1.67 Gb/s/pin", J. Solid State Circ., vol. 35, No. 11 (IEEE, 2000), pp. 1641-1647.
Kuge et al., "A 0.18-um 256-Mb DDR-SDRAM with Low-Cost Post-Mold Tuning Method for DLL Replica", J. Solid State Circ., vol. 35, No. 11 (IEEE, 2000), pp. 1680-1689.
Yoo et al., "A 1.8-V 200/Mb/s/pin 512-Mb DDR-II SDRAM With On-Die Termination and Off-Chip Driver Calibration", J. Solid State Circ., vol. 39, No. 6 (IEEE, 2004), pp. 941-951.
Fujisawa et al., "1.8-V 800-Mb/s/pin DDR2 and 2.5-V 400-Mb/s/pin DDR1 Compatibly Designed 1-Gb SDRAM With Dual-Clock Input-Latch Scheme and Hybrid Multi-Oxide Output Buffer", J. Solid State Cir., vol. 40, No. 4 (IEEE, Apr. 2005), pp. 862-869.
2GBIT (256M× 8 BITS) CMOS Nand E2PROM, part No. TH58NVG1S3AFT05 (Toshiba, 2003).

* cited by examiner

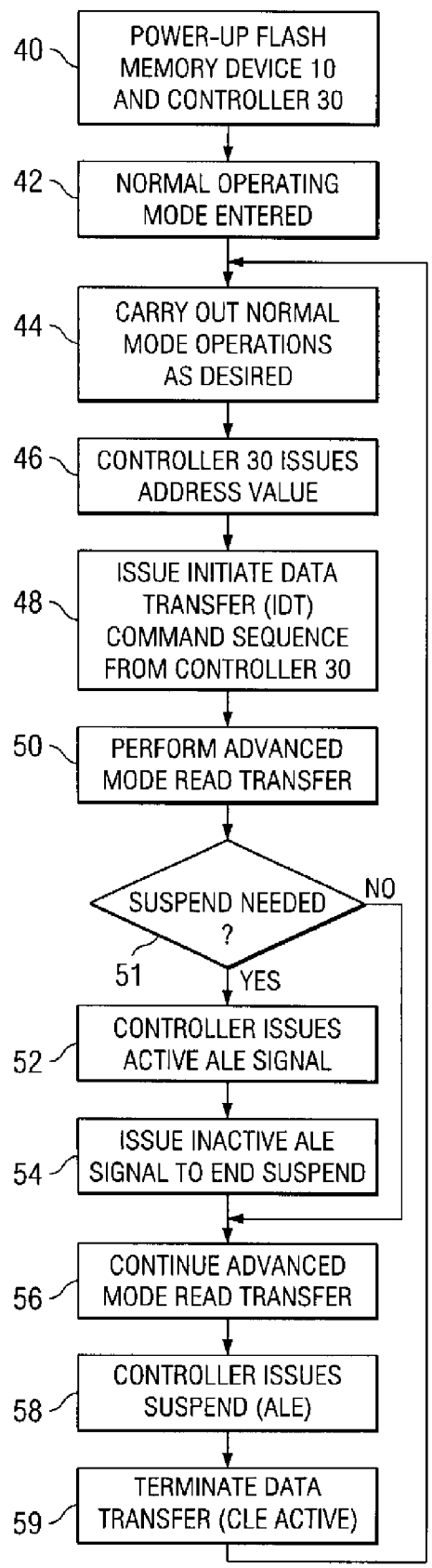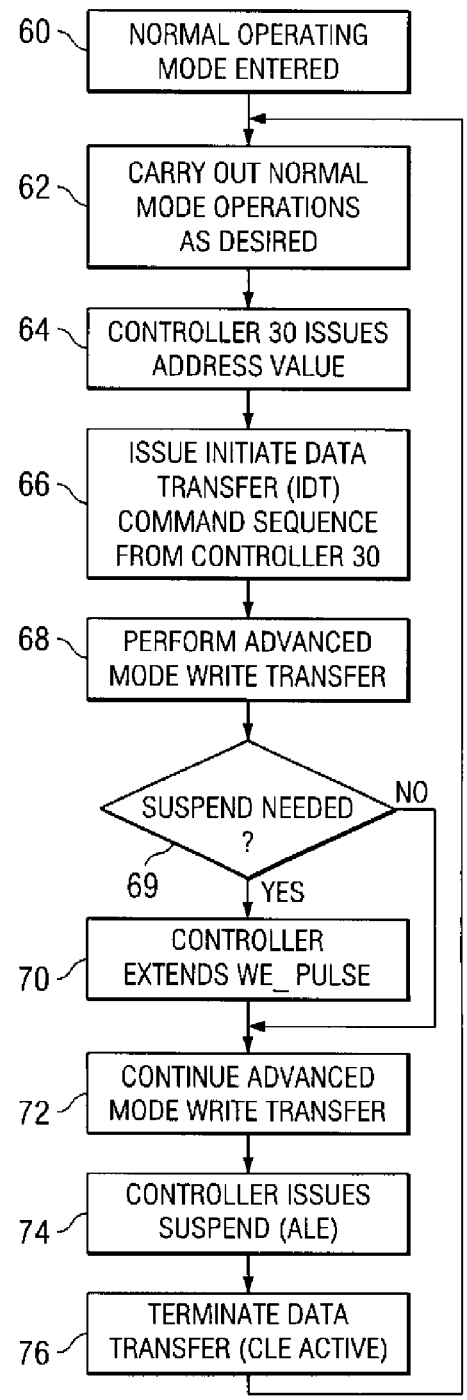

HIGH-PERFORMANCE FLASH MEMORY DATA TRANSFER

CROSS-REFERENCE TO RELATED APPLICATIONS

This application claims priority, under 35 U.S.C. §120, to copending application Ser. No. 11/379,895 filed Apr. 24, 2006, entitled "Method of High-Performance Flash Memory Data Transfer", and Ser. No. 11/379,910, filed Apr. 24, 2006, entitled "High-Performance Flash Memory Data Transfer", both commonly assigned with this application, and is related to my copending and commonly assigned application Ser. No. 11/424,573, filed on the same day as this application, entitled "Method of High-Performance Flash Memory Data Transfer".

STATEMENT REGARDING FEDERALLY SPONSORED RESEARCH OR DEVELOPMENT

Not applicable.

BACKGROUND OF THE INVENTION

This invention is in the field of flash memory devices, and is more specifically directed to data communications between flash memory devices and memory controllers in electronic systems.

As well known in the art, "flash" memories are electrically-erasable semiconductor memory devices that can be erased and rewritten in relatively small blocks, rather than on a chip-wide or large-block basis as in previous electrically-erasable programmable read-only memory (EEPROM) devices. As such, flash memory has become especially popular for applications in which non-volatility (i.e., data retention after removal of power) of the stored data is essential, but in which the frequency of rewriting is relatively low. Examples of popular applications of flash memory include portable audio players, "SIM" card storage of telephone numbers and phone activity in cellular telephone handsets, "thumbkey" removable storage devices for computers and workstations, storage devices for digital cameras, and the like.

An important recent advance in semiconductor non-volatile memory technology is the arrangement of the flash memory cells as "NAND" memory rather than as "NOR" memory. As known in the art, NOR flash memory refers to the conventional arrangement of a column of memory cells in parallel between a bit line and a source line. Access of a specific cell in a NOR column is made by driving its word line (control gate) active while holding the other cells in the column off, so that the current between the bit line and source line is determined by the state of the accessed cell. Memory cells in a column of NAND memory, on the other hand, are connected in series between the bit line and the source line. Accessing of a specific cell in a NAND column thus requires turning on all of the cells in the column with active word line levels, and applying an intermediate word line level to the cell to be accessed, such that the current between the bit line and source line is, again, determined by the state of the accessed cell. As well known in the art, the chip area required per bit of NAND flash memory is much reduced from the area per bit of NOR flash memory, primarily because fewer conductors (and therefore contacts) are required for a column of NAND memory relative to NOR memory; in addition, access transistors can be shared among a large number of cells in the NAND arrangement.

Additionally, conventional NAND flash memory is conveniently accessed serially, for example by sequentially accessing cells along the columns, rather than as a random access memory as in the case of NOR memory. NAND memory is thus especially well-suited for music and video storage applications Another important recent advance in the field of flash memory is referred to in the art as the multilevel program cell (MLC). According to this approach, more than two data states are made possible for each memory cell, simply by more finely controlling the programming of the cell. In conventional binary data storage, each memory cell is programmed into either a "0" or a "1" state. Reading of such binary cells is accomplished by applying a single control voltage to the control gate of the addressed memory cell so that the transistor conducts if programmed to a "1" state, but remains off in the "0" state; sensing of the conduction through the addressed memory cell thus returns the programmed state of the cell. In contrast, according to a typical example of the MLC approach, four possible states are defined for each memory cell, typically corresponding to binary values 00, 01, 10, 11. In effect, the two intermediate states correspond to two levels of partial programming of the cell between the fully erased and fully programmed states. Some implementations of MLC flash memory with up to eight possible states, or three binary bits, per cell are known. The ability to store two or three bits of data on each memory cell immediately doubles or triples the data capacity of a flash memory chip. Examples of MLC flash memory cells and memories including such MLC cells are described in U.S. Pat. No. 5,172,338, and U.S. Pat. No. 6,747,892 B2, both commonly assigned herewith and incorporated herein by this reference.

The combination of MLC technology with the efficiencies of NAND flash memory architectures has resulted in significantly reduced cost per bit for semiconductor non-volatile storage, as well as improved system reliability, and a higher data capacity and system functionality for a given form factor. However, despite these important improvements, the data transfer rates to and from conventional flash memory devices have not kept pace. Certain modern applications of flash memory are especially sensitive to data transfer rates, especially as the data capacity increases. For example, the resolution of high-performance, professional level, digital still cameras now can exceed 10 megapixels, for which the advances of MLC NAND flash memory technology are welcome. However, the "shutter lag" between successive image captures depends on the data transfer rate of the image data from the sensor into flash memory. This delay time between images (which, to the camera user, is considered as an independent parameter, not dependent on image resolution) is becoming a critical factor in these cameras. Especially as the image resolution continues to increase, it has been observed that conventional data transfer times are not adequate to achieve the desired delay time between images. Nor are the data transfer times into and out of conventional flash memory competitive with those of modern magnetic disk drives, which is of course another desirable new application for flash memory. Accordingly, in order for flash memory to meet the needs of modern high-performance digital still cameras, or to serve as solid-state mass storage in modern high-performance electronic systems, it will become necessary to achieve much higher data transfer rates to and from flash memory devices.

An example of a conventional data transfer approach for flash memories is described in the datasheet 2 GBIT (256M×8 BITS) CMOS NAND E²PROM, part number TH58NVG1S3AFT05 (Toshiba, 2003). This conventional approach involves an eight-bit data bus, with one bit presented on each data output per cycle of a read enable clock, synchronous with the falling edge of that read enable clock. Also as described in that datasheet, this conventional approach involves a 3.3 volt logic standard, such that the minimum high logic level output voltage ($V_{OH}$) is 2.4 volts and the maximum low logic level output voltage ($V_{OL}$) is 0.4 volts. This device provides a maximum data rate of 20 MHz. It is believed that this data rate is not an adequate data rate for mass storage in personal computer systems, and as such these conventional flash memories would not be suitable for disk drive replacement.

By way of background, some conventional dynamic random access memories (RAMs) implement so-called "double data rate", or "DDR", data transfer techniques. As known in that art, DDR data transfer involves the transfer of one or more data bits (depending on the number of bus lines) synchronously with both the rising and falling edges of the corresponding data strobe, or clock. DDR data transfer thus communicates data at twice the data rate of conventional synchronous data transfer, which is synchronous with only one of the clock edges (rising or falling edge). In addition, conventional DDR dynamic RAMs utilize source-synchronous data strobes, in which the RAM device itself generates the data strobe for reads from the memory (while the external circuitry generates the data strobe for writes to the memory). However, this doubling of the input/output switching rate increases the power consumption of data transfer, approaching twice that of single-data rate communications.

Power consumption in modern electronic systems is a substantial concern, however, and the driving of buses and conductors in transferring data among integrated circuit devices in a system is a significant contributor to overall system power consumption. As is fundamental in the art, the power consumption of output driver circuits, for driving external conductors, relates directly to the switching rate of digital signals to be driven. Increasing the data transfer rate to approach those of modern magnetic disk drives, as mentioned above, thus will require a corresponding increase in the power consumed by such data transfer, keeping all other parameters equal. This increased power consumption requires larger driver and receiver devices, improved heat dissipation in system applications, and the like, all of which add cost to the overall system. Even if these changes are made, the increased power consumption from high-speed data transfer is undesirable for portable electronic systems, such as digital cameras, laptop computers and workstations, wireless telephone handsets, personal digital audio players, and similar battery-powered devices.

By way of further background, a communications protocol known as Ultra DMA Mode is known in the art, for communications to and from a flash memory card, such as a COMPACT FLASH, or CF+, flash memory card. FIG. 1 illustrates such a conventional flash memory card, constructed and operating according to the well-known standard CF+ and CompactFlash Specification Revision 3.0 (CompactFlash Association, 2004). As shown in FIG. 1, flash memory card 2, which in this example is constructed as a COMPACT FLASH storage card according to this standard, contains one or more flash memory modules 2, and single chip memory controller 4. Flash memory module 4 communicates data to and from memory controller 6 over bus data_I/O, and receives and issues control signals to and from memory controller 6 over control bus ctrl. In this example, the data transfer approach described in the above-referenced Toshiba datasheet corresponds to these communications over the data_I/O and ctrl buses between flash memory module 4 and memory controller 6. Memory controller 6 communicates with a host device (e.g., digital camera, digital audio player, personal computer, etc.) over host interface HOST_IF. The above-referenced CF+ and CompactFlash Specification describes communications over host interface HOST_IF, including according to the Ultra DMA Mode ("UDMA"). As described in that specification, UDMA communications are carried out in a special operating mode, initiated by the driving of a signal on a control line (UDMARQ) by the agent (host or memory card 2) that desires such communication. Also as described in that specification, UDMA data transfers are source-synchronous, in that the agent (memory card 2 or host system) that is placing the data onto bus HOST_IF is also issuing the data strobe signal. In addition, also as described in that specification, both rising and falling edges of the strobe signal are used in the transfer of data under the UDMA mode of operation.

However, it has been observed, in connection with this invention, that even with the UDMA mode for the host interface in the flash card of FIG. 1, the data transfer rate between the memory module 4 and memory controller 6 will limit the overall performance of memory card 2. However, the speeding up of data transfer at that interface according to conventional techniques will also greatly increase power consumption within memory card 2. In addition, it is known in the art that modification to input/output interfaces of memory integrated circuits will greatly limit the usability of such integrated circuits, adding cost from the standpoint of inventory control and design overhead.

BRIEF SUMMARY OF THE INVENTION

It is therefore an object of this invention to provide a flash memory module having a high-performance data transfer mode, for data transfer to and from a memory controller.

It is a further object of this invention to provide such a module in which data transfer according to the high-performance mode consumes power at a rate that is not substantially greater than conventional data transfer.

It is a further object of this invention to provide such a module in which "legacy" data communications can also be carried out, to provide backward-compatibility with conventional data transfer standards.

It is a further object of this invention to provide such a module in which data skew in the high-performance data transfer mode is minimized.

Other objects and advantages of this invention will be apparent to those of ordinary skill in the art having reference to the following specification together with its drawings.

The present invention may be implemented into a flash memory device having a multiple-mode data interface. In a legacy mode, the data interface presents or receives data synchronously with an externally-generated data strobe, with one bit per conductor communicated in each cycle of the strobe. In an advanced mode, the data interface is source-synchronous, with a data bit or word synchronous with either a rising or falling edge of a strobe signal that is at twice the frequency of the legacy mode strobe. A reduced voltage swing is provided for the advanced mode, to reduce power consumption. Upon invocation of the advanced mode for data transfers, the legacy operating mode continues to be used for command and control communications; data timeout and other automated control functions are provided for the advanced operating mode.

BRIEF DESCRIPTION OF THE SEVERAL VIEWS OF THE DRAWING

FIGS. 5a and 5b are flow diagrams illustrating the operation of advanced mode read data transfers and write data transfers, respectively, according to the preferred embodiments of the invention.

DETAILED DESCRIPTION OF THE INVENTION

The present invention will be described in connection with its preferred embodiment, namely as implemented into a flash memory module, and a subsystem including such a flash memory module, and method of operating the same. More specifically, this exemplary flash memory module is described as a multi-level cell (MLC) flash memory of the NAND type, as it is contemplated that this invention will be particularly useful in connection with such flash memories, in order to enable the use of solid-state non-volatile memory for mass data storage in computer systems. However, it is contemplated that this invention will be useful and beneficial in other applications involving non-volatile solid-state memories of various types. Accordingly, it is to be understood that the following description is provided by way of example only, and is not intended to limit the true scope of this invention as claimed.

Figure 2:
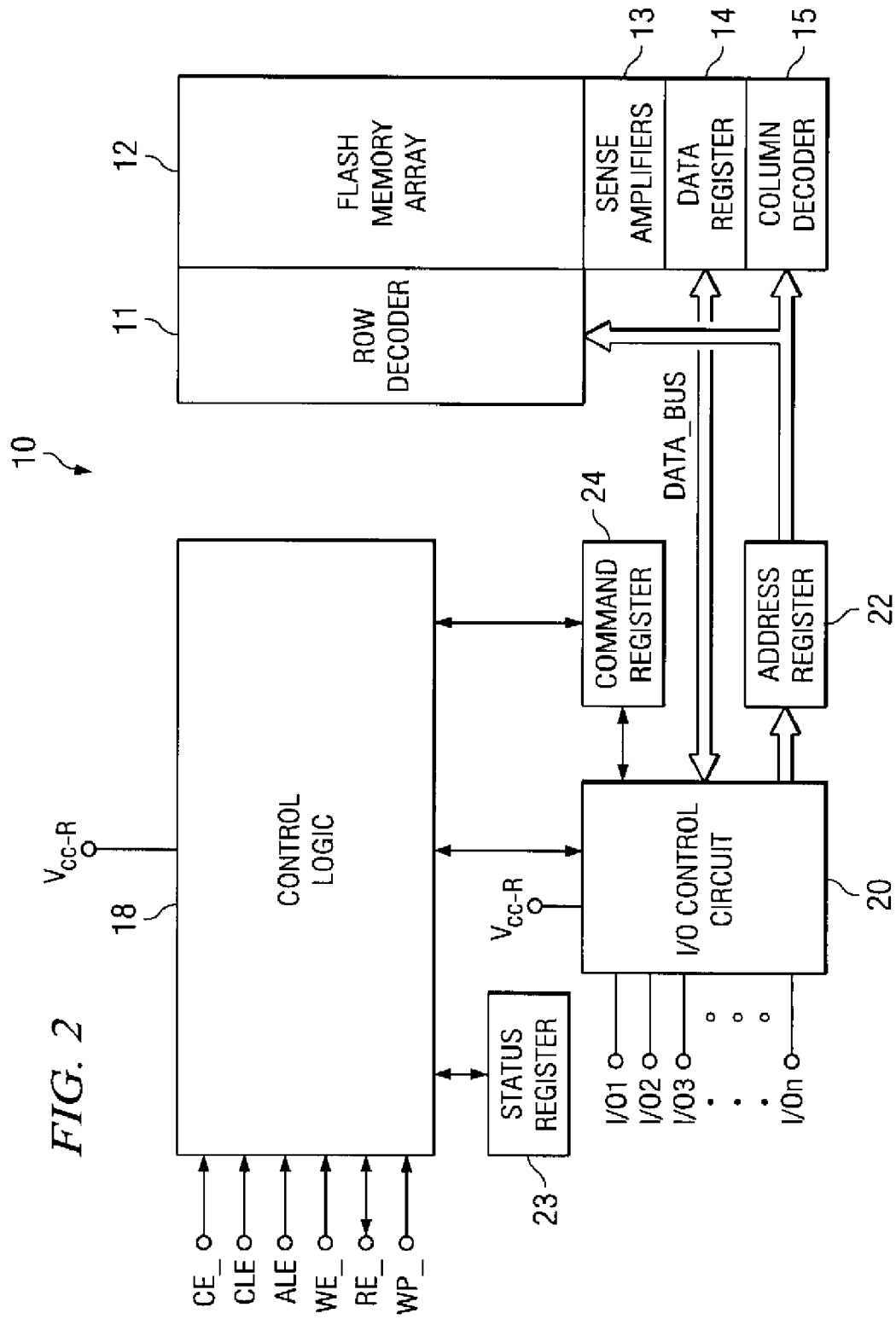
FIG. 2 is an electrical diagram, in block form, of a memory module constructed according to the preferred embodiment of the invention.

FIG. 2 illustrates an exemplary construction of flash memory device (or module) 10 constructed according to a preferred embodiment of the invention. It is contemplated that flash memory device 10 will typically be constructed into a single integrated circuit, and as such may be interfaced with any one of a number of memory controllers or memory controller logic, as will be described in further detail below. It is also contemplated that the architecture of flash memory device 10 illustrated in FIG. 2 is merely an example presented for purposes of comprehending this invention, and that those skilled in the art having reference to this specification can readily realize this invention in connection with flash memory devices of architectures varying from that shown in FIG. 2.

The storage capability of flash memory device 10 resides in flash memory array 12. Array 12 includes electrically programmable and erasable memory cells arranged in rows and columns, as known in the art. While a single array 12 is shown in FIG. 2, it is of course contemplated that array 12 may be realized as multiple sub-arrays, each having a separate instance of peripheral circuitry, such as part or all of the address, data, or control circuitry described in further detail below relative to the example of FIG. 2. It is contemplated that those skilled in the art having reference to this specification will be readily able to realize this invention in connection with such multiple sub-array architectures. In this example, the memory cells of array 12 are floating-gate metal-oxide-semiconductor (MOS) transistors, constructed so that each such transistor, corresponding to one memory cell, can be electrically programmed and also electrically erased. According to the preferred embodiment of the invention, the memory cells of array 12 are multi-level cells (MLC), in that they may be programmed to more than two data states (i.e., to any of more than two threshold voltages), so that each such cell stores a multiple-bit digital value. Also according to this preferred embodiment of the invention, as will be evident from the following description, these memory cells are preferably arranged in the well-known NAND fashion, such that the cells are typically not randomly accessed but are rather accessed serially, as useful for mass storage applications. Of course, this invention may also be used in connection with binary memory cells (i.e., storing only a single digital bit), and in connection with NOR arrangements of the memory cells.

According to this preferred embodiment of the invention, common input/output terminals I/O1 through I/On are provided, and connected to input/output control circuit 20. As known in the art for NAND type flash memories, the operation of flash memory device 10 is controlled in large part by the receipt and execution of commands, communicated as digital words over input/output terminals I/O1 through I/On, and executed by control logic 18. As such, input/output control circuit 20 receives control commands, address values, and input data, and presents status information and output data, via its driver and receiver circuitry that communicate with input/output terminals I/O1 through I/On. It is contemplated that the number n of input/output terminals I/O1 through I/On will generally be eight or sixteen, although, of course, any number of such terminals may be provided. In addition, input/output control circuit 20 receives power supply voltage $V_{cc-R}$ and drives input/output terminals I/O1 through I/On with logic levels based upon that voltage. According to this preferred embodiment of the invention as will be described in detail below, this power supply voltage $V_{cc-R}$ is at a lower voltage than that used in conventional flash memory devices, so that the power consumption resulting from data transfers at input/output terminals I/O1 through I/On is reduced, even at higher switching rates. Control logic 18 also receives this power supply voltage $V_{cc-R}$ based upon which it will drive output control signals at the lower voltages from read enable terminal RE_, among others.

Input/output control circuit 20 forwards command information to command register 24, for decoding and execution by control logic 18, as it controls the operation of flash memory device 10. Status information is stored by control logic 18 in status register 23, in the conventional manner. Address values received at input/output terminals I/O1 through I/On by input/output control circuit 20 are buffered in address register 22; the row portion of such addresses is decoded by row decoder 11 and the column portion is decoded by column decoder 15 (each of which typically includes an address buffer), to effect selection of the desired cell or cells in array 12, in the conventional manner. Input/output control circuit 20 is also in bidirectional communication with data register 14, via bus DATA_BUS, to forward data to be written to data register 14, and to receive output data from data register 14, depending upon the direction of the data transfer to be executed. Control logic 18 also receives various direct control signals from external to flash memory device 12, including, for example, lines for the signals of chip enable CE_, command latch enable CLE, address latch enable ALE, write enable WE_, read enable RE_, and write protect line WP_. As known in the art, the command latch enable CLE and address latch enable ALE signals indicate whether a command or address is being presented on input/output terminals I/O1 through I/On, while the write enable WE_ and read enable RE_ signals serve as the data strobes in write and read operations, respectively.

According to this embodiment of the invention, the write enable WE_ signal is an input to flash memory device 10. Accordingly, for the transfer of data into flash memory device 10 via input/output terminals I/O1 through I/On, the write data strobe conveyed as the write enable WE_ signal is always sourced by a device external to flash memory device 10, typically by the source of the incoming data itself. However, also according to the preferred embodiment of this invention and as will be described in further detail below, the read enable RE_ signal is bidirectional. In a normal operating mode, the external device that is the destination of data being read from flash memory array 12 is the source of the read data strobe, which is then conveyed as an input to flash memory device 10 as the read enable RE_ signal. In an advanced operating mode according to the preferred embodiment of the invention, as will be described in further detail below, control logic 18 issues the read data strobe as the read enable RE_ signal, synchronous with data read from flash memory array 12 and communicated via data register 14, I/O control circuit 20 and input/output terminals I/O1 through I/On.

Figure 1:
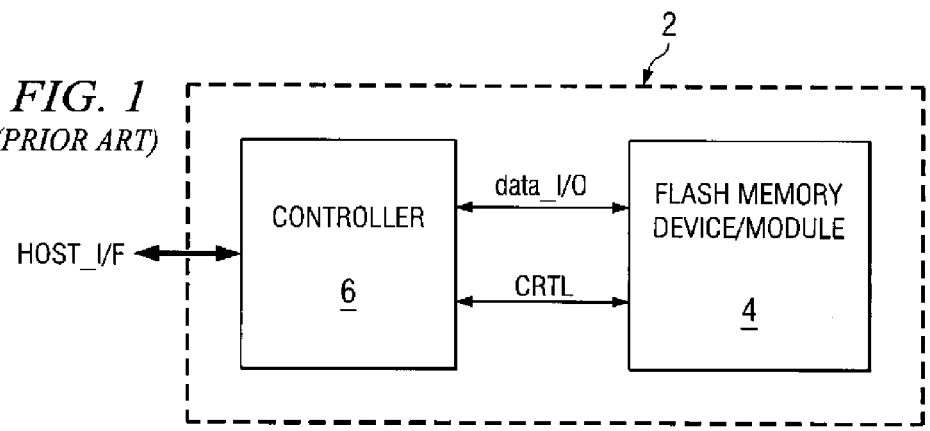
FIG. 1 is an electrical diagram, in block form, of a conventional memory card.
Figure 3:
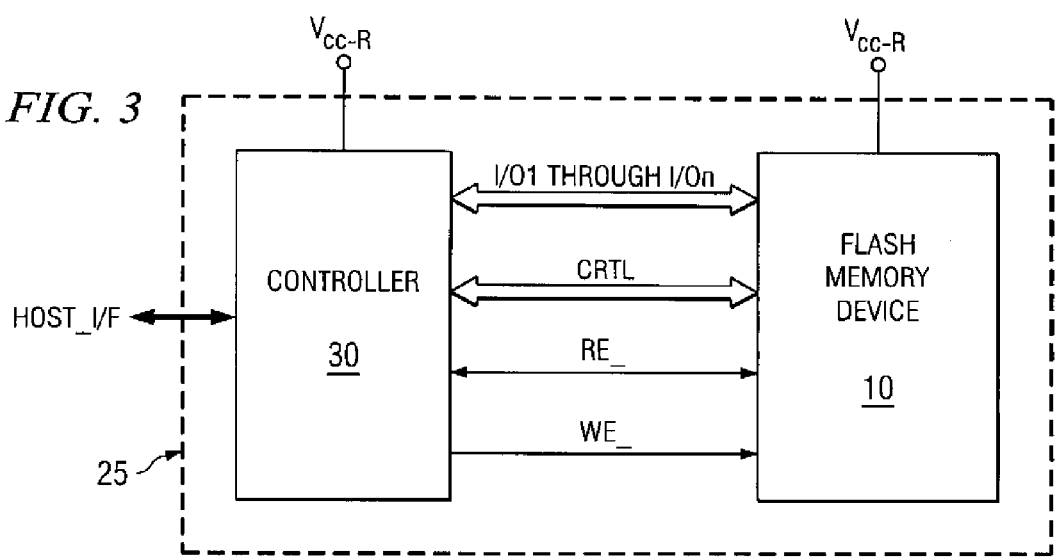
FIG. 3 is an electrical diagram, in block form, of the memory module of FIG. 2 implemented into a system or subsystem in combination with a single-chip memory controller, according to the preferred embodiment of the invention.

FIG. 3 illustrates an implementation of flash memory device (or module) 10 into flash memory card 25, according to a preferred embodiment of the invention. As shown in FIG. 3, flash memory card 25 includes at least flash memory device 10 itself and also controller 30. Controller 30 provides and manages an external interface HOST_IF to a host system, such as a high-performance digital camera, a personal computer, or a portable device such as a digital audio player or cellular telephone handset or the like; interface HOST_IF may also correspond to a set of external terminals of flash memory card 25 constructed as a general purpose card that may be inserted into any one of a wide range of host systems, as known in the art. It is contemplated that interface HOST_IF may operate according to a conventional standard interface as known in the art currently, or as may be developed in connection with future flash memory interface standards or proprietary interface protocols. As mentioned above, it is contemplated that this invention will be especially beneficial in providing high speed data transfer, such as in the data transfer rate critical application of a high-performance digital still camera. It is further contemplated that the high data transfer rates provided by this invention can also enable the use of flash memory as a solid-state mass storage device in a personal computer, replacing magnetic disk drives. As such, it is contemplated that interface HOST_IF will best have high-speed data transfer capability, for example as contemplated by the UDMA standard mentioned above in the Background of the Invention.

As shown in FIG. 3, flash memory device 10 is coupled to controller 30 in a manner consistently with the terminals shown in FIG. 2. In this regard, an input/output bus is formed by signal lines I/O1 through I/On, corresponding to similarly named terminals of flash memory device 10. A control bus CTRL couples controller 30 to flash memory device 10, and includes signal lines connected to the ALE, CLE, WP_, and CE_ terminals shown in FIG. 2. It is contemplated that other control lines and terminals may also be provided for communication between flash memory device 10 and controller 30, and as such control bus CTRL is illustrated as a bidirectional bus, even though the ALE, CLE, WP_, and CE_ terminals are shown in FIG. 2 as inputs to flash memory device 10.

FIG. 3 illustrates two control lines, RE_ and WE_, separately from control bus CTRL, for the sake of clarity of this description. According to this embodiment of the invention, line WE_ carries the data strobe in write operations (data written from controller 30 to flash memory device 10), and as such is connected to terminal WE_ of flash memory device (FIG. 2). According to this preferred embodiment of the invention, the data strobe on line WE_ is sourced by controller 30 in each of the operating modes. Line RE_ carries the data strobe for read operations (data read from flash memory 10 and communicated to controller 30), and as such is connected to terminal RE_ of flash memory device 10 (FIG. 2). As mentioned above, according to this preferred embodiment of the invention, line RE_ is bidirectional, with the source of the read data strobe depending on the current operating mode of flash memory device 10. In a normal operating mode, controller 30 sources the read data strobe, in response to which flash memory device 10 maintains as valid data it presents on signal lines I/O1 through I/On. In an advanced operating mode according to the preferred embodiment of the invention, flash memory device 10 sources the read data strobe on line RE_ for data transfer from flash memory device 10 to controller 30. As will be described in further detail below, commands communicated by controller 30 over signal lines I/O1 through I/On are synchronous with a read data strobe source on signal line RE_, regardless of the operating mode in which flash memory device 10 is transferring data to controller 30.

It is contemplated that controller 30 will be constructed substantially according to conventional flash memory controller architectures, as known in the art, modified as necessary to effect the operations described in this specification in connection with the initiation, operation, and termination of read operations in the advanced operating mode of flash memory device 10 according to the preferred embodiment of the invention. It is also contemplated that the logic hardware, program instructions, or combination thereof for implementing these advanced operating mode functions within controller 30 will be apparent to those skilled in the art having reference to this specification. As such, it is further contemplated that those skilled readers will be readily able to implement such modifications of controller 30, as best appropriate for a particular realization, without undue experimentation.

And, also as shown in FIG. 3, power supply voltage $V_{cc-R}$ is connected to, and biases, each of flash memory device 10 and controller 25. This power supply voltage $V_{cc-R}$ is at a lower voltage than that used in conventional flash memory devices and controllers, so that the power consumption resulting from data transfers and transitions over input/output lines I/O1 through I/On and the various control lines is reduced, even at higher switching rates as will be described below. As will be discussed in further detail below in connection with a particular example, this power supply voltage may be at a nominal voltage of about 1.80 volts, within a range from about 1.60 volts to about 2.00 volts, which is substantially lower than the conventional standard nominal power supply voltage of 3.30 volts, within a specification range of between 2.70 volts and 3.60 volts.

Referring now to FIGS. 4a through 4e, the operation of flash memory device 10 in combination with controller 30 in memory card 25, according to a normal operating mode and also a command communication mode, will now be described. It is contemplated that these operating modes will substantially correspond to conventional flash memory interface protocols for modern flash memory devices, and as such these operating modes will serve as a "legacy" input/output protocol for flash memory device 10 according to the preferred embodiment of the invention.

Figure 4A:
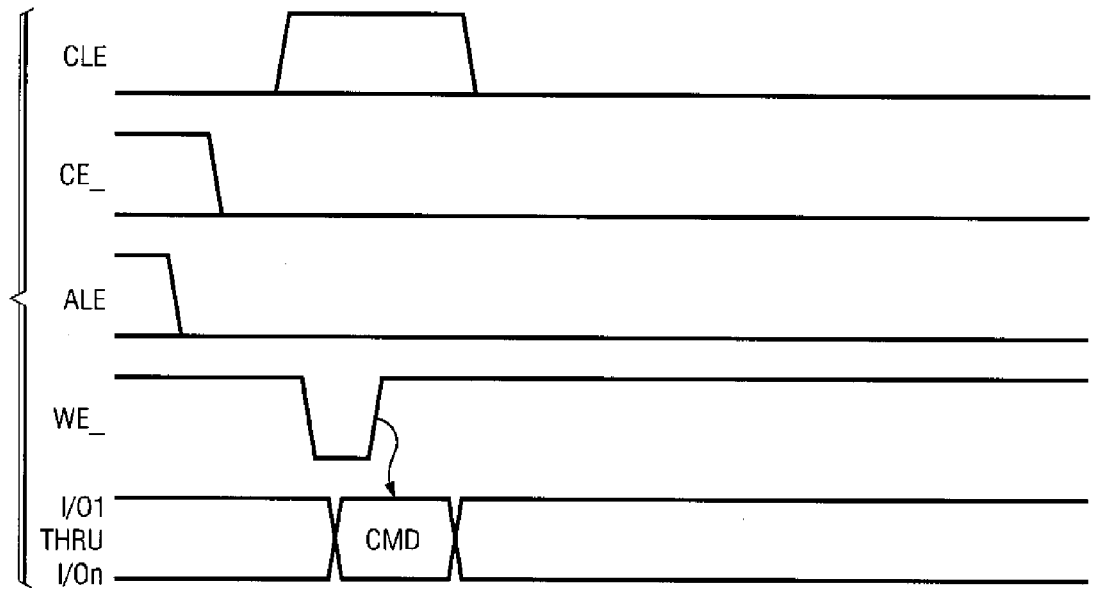
FIGS. 4a through 4d are timing diagrams illustrating the operation of the flash memory module of FIGS. 2 and 3 in a normal operating mode, and in the communication of commands, according to the preferred embodiment of the invention.

FIG. 4a illustrates the communication of a command from controller 30 to flash memory device 10. As known in the art, and as will be described in further detail below, modern flash memory devices operate in response to specific commands that are issued by a controller, and that are communicated over the data input/output lines. As such, in this example, the communication of a command CMD is effected by controller 30 driving command latch enable signal CLE to a high active state, and address latch enable signal ALE to a low inactive state, signifying that a command, rather than an address, will be communicated on input/output lines I/O1 through I/On. Chip enable signal CE_ is taken active low, enabling flash memory device 10 in the conventional manner; as known in the art, if multiple flash memory devices 10 are provided within card 25, individual chip enable signals CE_ can be used by controller 30 as it selects the desired one of the flash memory devices 10 for communication. The digital word presented by controller 30 on input/output lines I/O1 through I/On, corresponding to command CMD as shown in FIG. 4a, is strobed by controller 30 issuing an active low pulse on write enable line WE_; the rising edge of the pulse on line WE_ causes I/O control circuit 20 to receive and latch in the command CMD, eventually reaching command register 24 (FIG. 2). Controller 30 can then return the command latch enable signal CLE to an inactive low state, terminating the command operation. Of course, as known in the art, multiple word commands, or multiple single-word commands, can be communicated sequentially in this manner, with command latch enable line CLE held high for the duration of such communications.

Figure 4B:
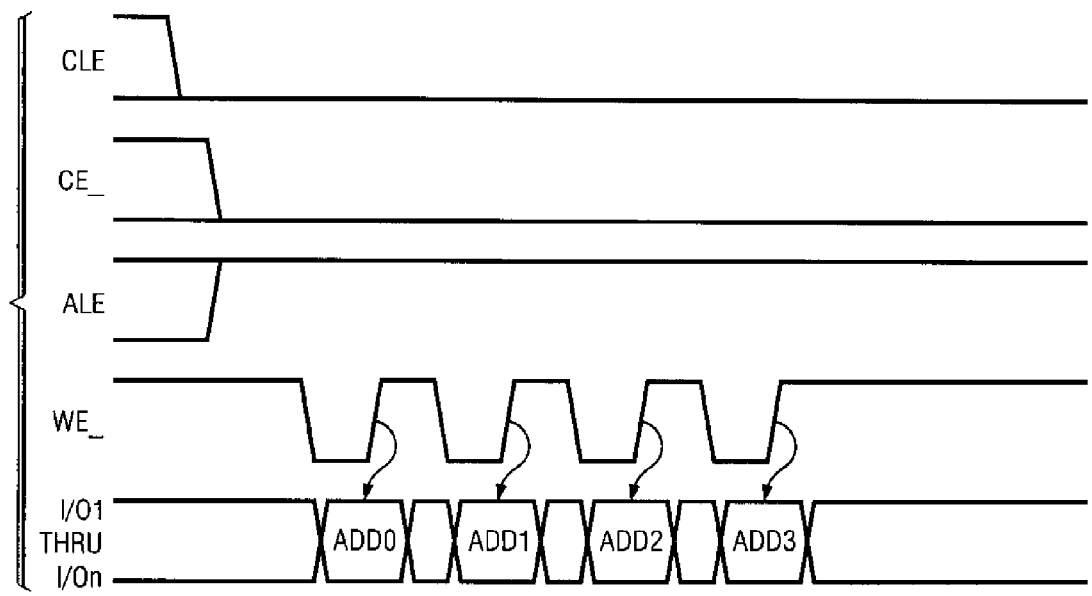

One command that is communicated in the manner illustrated in FIG. 4a is a command (e.g., command 00H for a read operation; command 10H for a serial data input program, or write, operation) indicating that a memory address will be communicated by controller 30 to flash memory device 10. FIG. 4b illustrates the timing of the communication of such an address by controller 30 to flash memory device, in a normal and command operating mode according to the preferred embodiment of the invention. As such, the operation illustrated in FIG. 4b follows the communication of a command 00H, according to the sequence of FIG. 4a, indicating the imminent transmission of a memory address in the next signal sequence.

A relatively wide range of commands can be communicated by controller 30 to flash memory device 10 in this normal operating mode. The following table lists an exemplary command set in this preferred embodiment of the invention:

| Command | Command code (hexadecimal) |
|---|---|
| Serial data input | 80 |
| Auto program | 10 |
| Read address input | 00 |
| Column address change during serial data output | 05 |
| Read start | 30 |
| Read column address change | E0 |
| Auto block erase | 60, D0 (two cycle command) |
| ID read | 90 |
| Status read | 70 |
| Reset | FF |

Referring now to FIG. 4b, the transmission of a memory address from controller 30 to flash memory device 10 according to this preferred embodiment of the invention will be described. In this operation, controller 30 drives command latch enable signal CLE inactive low, and drives address latch enable signal ALE high, indicating to flash memory device 10 that an address value will be communicated (rather than a command value) on input/output lines I/O1 through I/On. The chip enable signal CE_ is also driven active low, indicating that controller 30 is selecting flash memory device 10 as the recipient of this address information. In this operation, controller 30 issues active low pulses of the write enable signal WE_, each pulse indicating a portion of the address value then presented by controller 30 on input/output lines I/O1 through I/On. In this embodiment of the invention, this address information is synchronous with the rising edge (i.e., end of the active low pulse) of write enable signal WE_, such that flash memory 10 can use this edge to latch the then-current state of input/output lines I/O1 through I/On into address register 22 (FIG. 2) as a portion of the desired memory address. As evident in the example of FIG. 4b, the memory address extends over multiple words (the width of which is defined by the number n of input/output lines I/O1 through I/On). In this case, the memory address includes four address words ADD0 through ADD3 that are presented synchronously with successive active low pulses of write enable signal WE_.

Figure 4C:
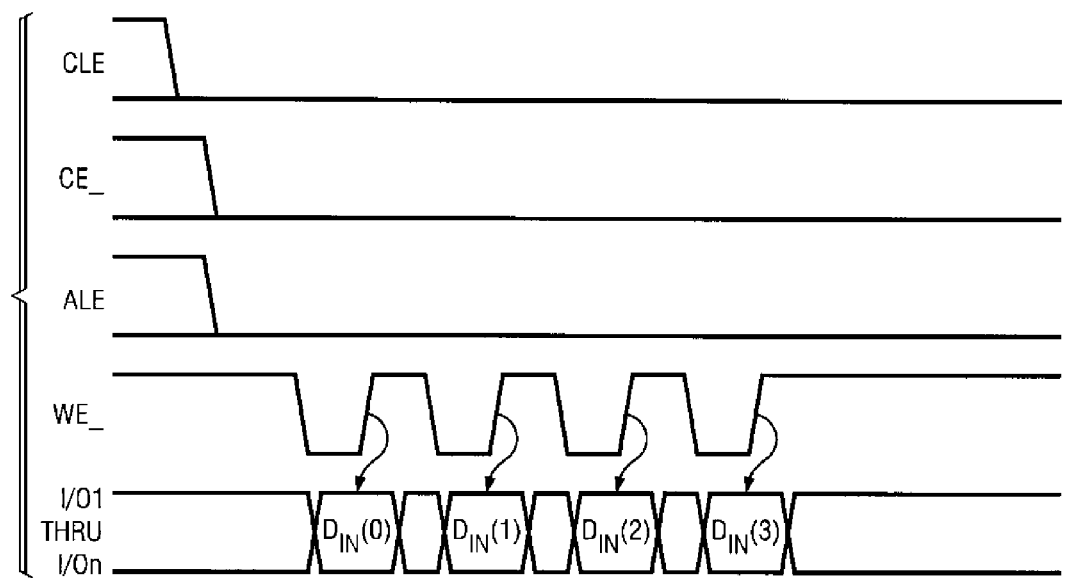

Following the communication of an address value as shown in FIG. 4b, controller 30 can perform a write of data to flash memory device 10, or a read of data therefrom. FIG. 4c illustrates the signals communicated to effect a write operation, according to this preferred embodiment of the invention, and in a normal operating mode (i.e., a "legacy" mode). According to the architecture of FIG. 2, this data write operation is a write of data to data register 14. As such, according to the preferred embodiment of the invention, a write to data register command (e.g., command value 80H) is effected, in the manner shown in FIG. 4a, following which the destination memory address within flash memory device 10 is communicated by controller 30, both prior to the write operation to now be descried relative to FIG. 4c. To effect a data write operation, controller 30 drives command latch enable signal CLE and address latch enable signal ALE both inactive low, indicating to flash memory device 10 that input data to be written (i.e., neither a command nor an address value) will be communicated on input/output lines I/O1 through I/On. Of course, chip enable signal CE_ is also driven active low for this operation. Controller 30 then issues active low pulses of the write enable signal WE_ along with each byte or word of data presented on input/output lines I/O1 through I/On. In this embodiment of the invention, as in the case of command and address transmissions, the valid input data is presented synchronous with the rising edge of write enable signal WE_ at the end of each pulse. In response to this edge, flash memory device 10 latches the then-current state of input/output lines I/O1 through I/On, corresponding to a word or byte of input data, either into data latch within I/O control circuit 20, or directly (or eventually, as the case may be) over bus DATA_BUS to data register 14. FIG. 4c illustrates the communication of four words $D_{in}(0)$ through $D_{in}(3)$ over input/output lines I/O1 through I/On, synchronous with four pulses of write enable signal. WE_.

Figure 4D:
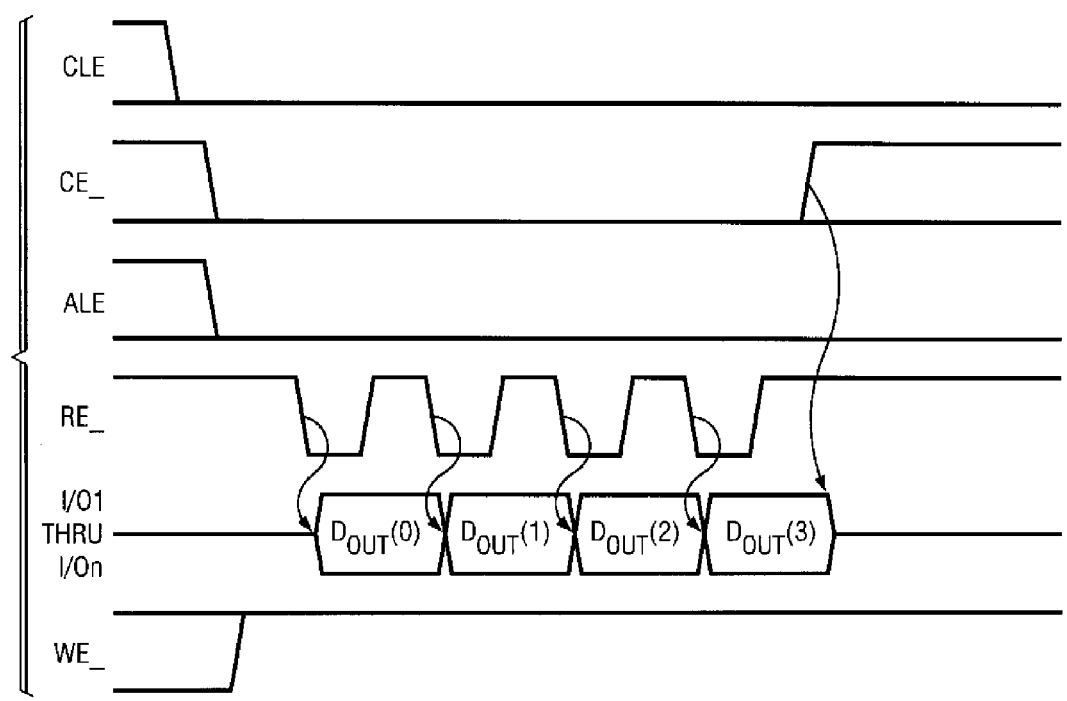

FIG. 4d illustrates the operation of controller 30 and flash memory device 10 in carrying out a data read operation (from flash memory device 10 to controller 30) in a normal operating ("legacy") mode according to the preferred embodiment of the invention. As in the case of a data write operation, a command sequence (e.g., as shown in FIG. 4a) and an address sequence (e.g., as shown in FIG. 4b) has previously been carried out prior to this read operation. One or more write operations may also have been previously carried out before this read (i.e., in which case, if the read is to the same address as has just been written, this read would serve as a verify of the previous write), or a write operation (e.g., as shown in FIG. 4c) may be performed after this read operation, in the form of a read-modify-write sequence to the same memory address. In response to the communication of an address prior to a read, the contents of the memory cells corresponding to that address are sensed, and forwarded to data register 14. As such, the read operation of FIG. 4d is a read of the current comments of data register 14. And in order to effect this read operation, controller 30 issues the appropriate command (e.g., command E0h) in a command operation in the manner described above relative to FIG. 4a.

In this operation, as in the data write operation, controller 30 has driven command latch enable signal CLE and address latch enable signal ALE both inactive low, and has driven chip enable signal CE_ active low. Controller 30 indicates a desired read operation by taking write enable signal WE_ inactive high. In this data read operation, flash memory device 10 outputs data words $D_{out}$ in response to falling edges of active low pulses of read enable signal RE_, as generated by controller 30. In this normal operating mode, therefore, controller 30 is able to synchronize the receipt of data from flash memory device 10 by issuing an active low pulse of read enable signal RE_, and then waiting a specified access time (permitting flash memory device 10 to effect some or all of the operations involved in sensing the states of its memory cells, and in forwarding the sensed states to its data register 14 and out to input/output lines I/O1 through I/On. Controller 30 can then latch into its input buffer the data states of input/output lines I/O1 through I/On to receive the data from flash memory device 10. In the example of FIG. 4d, four data words $D_{out}(0)$ through $D_{out}(3)$ are read in sequence; a rising edge of chip enable signal CE_ ends this read operation, following which flash memory device 10 causes its output drivers in I/O control circuit 20 to place input/output terminals I/O1 through I/On into a high-impedance ("high-Z") state.

Other operations according to this normal operating ("legacy") mode are also preferably available, such operations as known in the art. For example, controller 30 can read the contents of status register 24 in this normal operating mode by issuing a specific status command (e.g., command code 70H) following the timing of FIG. 4a, and receiving the contents of status register 24 over input/output lines I/O1 through I/On in response to its issuing of an active low pulse of read enable signal RE_.

As evident from FIGS. 4c and 4d, one data word or byte (referred to as "data word" in the following description) is communicated for each cycle of write enable signal WE_or read enable signal RE_, as the case may be. And as evident from these Figures and the foregoing description, controller 30 controls and sources both the write enable signal WE_ and the read enable signal RE_ in this normal operating mode. In the read operation, particularly, because only one data word is read for each complete cycle of read enable signal RE_, controller 30 has sufficient time, according to conventional flash memory timing requirements and performance, to itself issue its read data strobe (read enable signal WE_) and to receive and latch the read data. However, this level of performance may not necessarily be sufficient for high-speed use of flash memory device 10, such as when flash memory card 25 is used as mass data storage in a computer system. In addition, it is contemplated that this "legacy" mode of operation may not be able to keep up with the high speed external interface mode from controller 30 to the host system, such as under the UDMA interface protocol mentioned above.

According to the preferred embodiment of the invention, therefore, flash memory device 10 provides an advanced, higher performance, read and write operating mode, and controller 30 is constructed to take advantage of that advanced mode. The operation of flash memory device 10 and controller 30 in utilizing this advanced mode will now be described in detail, in connection with the flow diagrams of FIGS. 5a and 5b, and the timing diagrams of FIGS. 6a through 6e.

FIGS. 5a and 6a through 6c illustrate the operation of flash memory device 10 in performing a data read operation (i.e., from flash memory device 10 to controller 30, in flash memory card 25). In process 40 of FIG. 5a, flash memory device 10 and controller 30 are powered-up, which places both of these devices into the normal operating mode (process 42), as described above relative to FIGS. 4a through 4d. In process 44, read and write operations (if any) in this normal mode are carried out in this normal operating ("legacy") mode.

Figure 6A:
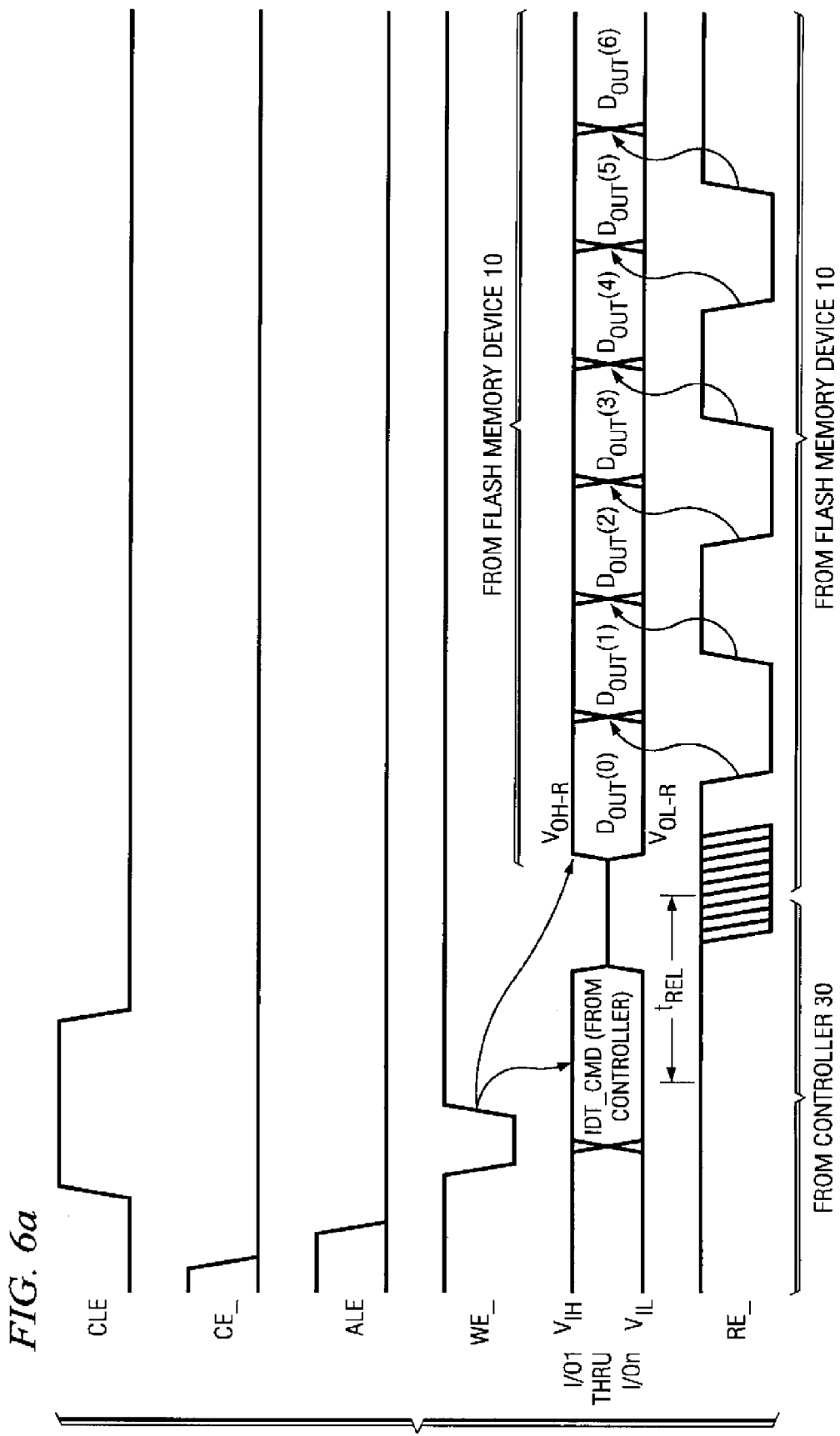
FIGS. 6a through 6e are timing diagrams illustrating signals involved in the operations of FIGS. 5a and 5b according to a first preferred embodiment of the invention.

Entry into the advanced read operating mode begins with process 46, in which controller 30 issues a memory address value to flash memory device 10 according to the normal operating mode, as described above relative to FIG. 4b. The memory address issued by controller 30 in process 46 is the initial memory address from which data will be read in this advanced operating mode, and preferably follows the transmission of the corresponding read address input command as described above. In process 48, controller 30 issues an "initiate data transfer", or "IDT", command sequence to flash memory device 10. FIG. 6a illustrates this operation in further detail.

According to the preferred embodiment of the invention, an "IDT" command is issued by controller 30 to flash memory device to initiate the advanced data transfer mode in process 48. This command is issued in a similar manner as the issuing of commands described above relative to FIG. 4a, with controller 30 driving chip enable signal CE_ active low, address latch enable signal ALE inactive low, and command latch enable signal CLE active high. The rising edge of an active low pulse of write enable signal WE_ serves as the data strobe for the IDT command value IDT_CMD (which is a binary word having a value different from other assigned command values) driven onto input/output lines I/O1 through I/On by controller 30. After a specified time following write enable signal WE_ being taken high, controller 30 places input/output lines I/O1 through I/On into a high-impedance state. And, after another elapsed time $t_{rel}$ following the rising edge of the write enable signal WE_, when strobing in the IDT command, controller 30 then also releases control of its read enable signal RE_, permitting control logic 18 of flash memory device 10 to drive the state of corresponding line RE_ (without risking data contention with controller 30).

Once the IDT command has been latched into and executed by flash memory device 10, flash memory device 10 then begins executing high-speed mode read data transfer process 50. As shown in FIG. 6a, this read data transfer process begins with flash memory device 10 issuing the first valid output data word $D_{out}(0)$, following the elapse of a non-zero access time after the rising edge of write enable signal WE_. Once it presents this first output data word $D_{out}(0)$, flash memory device 10 then begins issuing active pulses of read enable signal RE_, synchronous with additional output data words $D_{out}(1)$ et seq. According to this preferred embodiment of the invention, one data word $D_{out}(k)$ is issued synchronously with each edge, falling and rising, of the read enable signal RE_ driven by flash memory device 10 itself. In the example of FIG. 6a, each output data word $D_{out}(k)$ follows its strobe edge by a non-zero access time; alternatively, each read enable signal RE_ edge may be issued (or delayed to be issued) to controller 30 within its corresponding valid data word $D_{out}(k)$.

According to the preferred embodiment of the invention, therefore, the rate at which flash memory device 10 presents data to controller 30 via input/output lines I/O1 through I/On, in this advanced mode, is substantially faster than the data rate in the normal operating mode (FIG. 4d), approaching twice the data rate in typical realizations. This higher data rate is in part enabled by permitting flash memory device 10 to issue the read data strobe edges of read enable signal RE_, which eliminates the propagation delay and necessary timing windows that would be involved if controller 30 were issuing these read data strobe edges.

As will be apparent to those skilled in the art, however, the increased rate at which output data is presented on input/output lines I/O1 through I/On, with all other factors equal, substantially increases the power dissipation within flash memory card 25, primarily from the output drive circuit within I/O control circuit 20 of flash memory device 10 in this read operation. This power consumption is exacerbated as the data word width (i.e., the number n of input/output lines I/O1 through I/On) increase, as is the modern trend. According to the preferred embodiment of the invention, this power consumption is greatly reduced by reducing the voltage swing of the output signals on input/output lines I/O1 through I/On as will now be described.

Conventional flash memory devices utilize the well-known 3.3 volt bus standard, in which the minimum high level output voltage $V_{OH}$ is 2.4 volts and the maximum low level output voltage $V_{OL}$ is 0.4 volts, and for which the nominal voltage swing is about 3.3 volts. According to this standard, as well known in the art, these voltages are based on a power supply voltage that is nominally at 3.30 volts, and which has a specification range of between 2.70 volts and 3.60 volts. According to the conventional normal operating mode for modern flash memory devices, the output data rate is 25 MHz (i.e., a data transition every 40 nsec); in the worst case of a given input/output line I/Ok making a data transition in each cycle, flash memory device 10 would be required to charge the capacitance of input/output line I/Ok at a frequency of 12.5 MHz. Assuming a typical line capacitance of 65 pF for this input/output line I/Ok, the current consumption, in milliamperes, for one input/output line I/Ok can be calculated from:

$$I_k = f^*C(V_{OH} - V_{OL})$$

which, for this example, results in:

$$I_k = 12.5 * 0.065(3.3) = 2.681 \text{ mA}$$

using the typical 3.3 volt swing between the high and low data levels. The current consumed in driving read enable signal RE_ will be twice that of current $I_k$, as it must charge its corresponding conductor for every transition. The overall current consumed in the conventional normal operating mode for this example, assuming eight input/output lines I/O1 through I/O8, will therefore be:

$$I_{total} = 8(2.681) + 2(2.681) = 26.81 \text{ mA}$$

According to the preferred embodiment of the invention, the bus voltage is substantially reduced from this conventional 3.3v bus level, for example to a bus voltage of about 1.8 volts, defining the nominal voltage swing at about 1.80 volts. In this case, an example of the minimum high output level voltage $V_{OH-R}$ limit may be about 1.44 volts (80% of the nominal power supply voltage) and an example of the maximum low output level voltage $V_{OL-R}$ may be about 0.36 volts (20% of the nominal power supply voltage). In this reduced voltage operation, these voltages are based on a power supply voltage that is nominally at 1.80 volts, and which is permitted to range from about 1.60 volts to about 2.0 volts. Assuming the best case (for data transfer; worst case for current consumption) data rate of 50 MHz, the charging frequency for input/output lines I/O1 through I/On will be 25 MHz. The current $I_k$ consumed for a single input/output line I/Ok can thus be calculated:

$$I_k = 25 * 0.065(1.8) = 2.925 \text{ mA}$$

using the typical 1.8 volt swing between the high and low data levels. This current consumption, per input/output line, is thus not much different for the advanced operating mode, while providing twice the data rate. However, read enable signal RE_ is operating at the same frequency as in the normal operating mode (but clocking one data word with each edge, rather than only with the rising edge). But its voltage swing is of course also reduced, as it is also operating at the 1.8 volt bus voltage; as such, its current consumed is the same as that for one of the input/output lines. The overall current consumed in the advanced operating mode for this example, again assuming eight input/output lines I/O1 through I/O8, will therefore be:

$$I_{total} = 8(2.925) + 1(2.925) = 26.33 \text{ mA}$$

which is slightly less than that for conventional flash memory cards operating at the 3.3 volt bus voltage. And because this slightly lower current consumption is attained at a lower voltage swing (1.8 volts versus 3.3 volts) for the input/output signals, the power consumed in this advanced operating mode is substantially lower than that consumed in conventional flash memory cards. According to these examples, the power consumed in a conventional eight I/O flash memory in the normal operating mode will be about 88 mW (3.3 volts times 26.81 mA), while the power consumed by the example of the preferred embodiment of the invention described above will be about 47 mW (1.8 volts times 26.33 mA). This substantial reduction in power consumption is attained in combination with a substantial improvement in data transfer rate, approaching doubling of the data rate for large bursts.

According to the preferred embodiment of the invention, therefore, in which the advanced read data transfer is executed at these lower bus voltages (relative to conventional flash memory devices), the current consumed in the advanced mode is no worse than that consumed by conventional flash memory devices in the normal operating mode. And, according to this preferred embodiment of the invention in which flash memory device 10 has the capability of operating in the normal operating mode as well, the lower bus voltage is used in both the advanced mode and the normal operating mode, as well as for other operations including the communication of commands and address value. As such, flash memory device 10 consumes less power, in its transfer of data, than conventional flash memory devices.

As evident from the foregoing, command and address signals are communicated in the normal operating mode. For ease of implementation, the bus voltage for the communication of these signals is also preferably maintained at the lower bus voltage (e.g., 1.8 volts), providing additional reduction in the power consumption of flash memory card 25.

Referring back to FIG. 5a, flash memory device 10 according to this embodiment of the invention is capable of responding to a suspend request from controller 30. It is contemplated, according to this invention, that a suspend of the read data transfer may be deemed necessary by controller 30 for any one of a number of reasons, for example if its internal receive data buffer is full. As such, decision 51 of FIG. 5a determines whether such a suspend is required. If not, the high-speed read data transfer continues in process 56, in the manner described above relative to FIG. 6a.

Figure 6B:
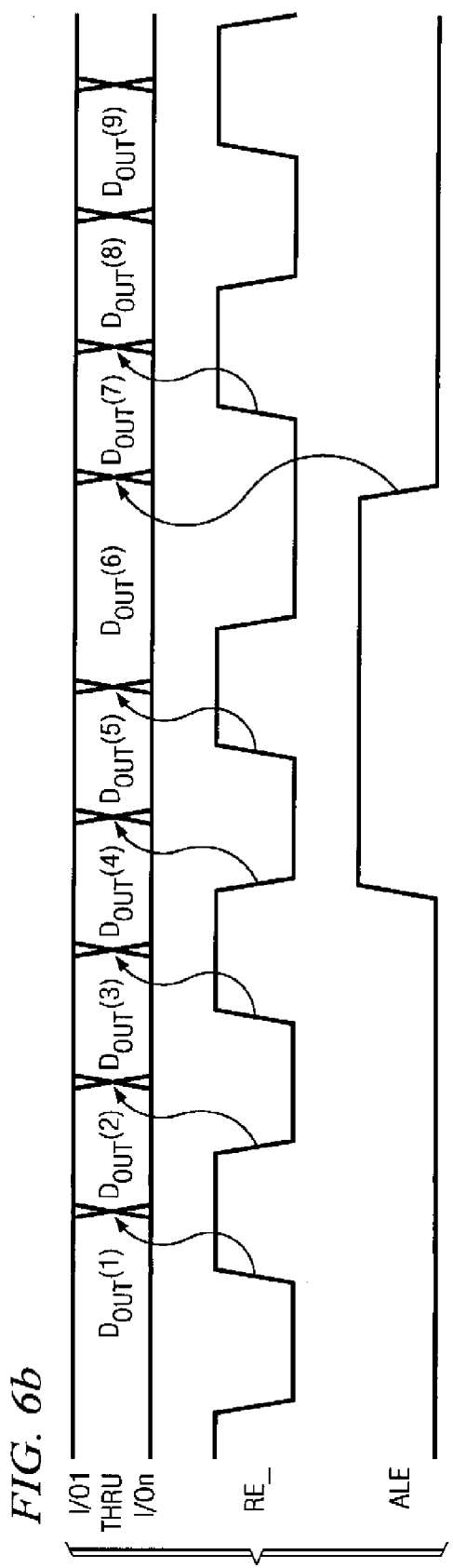

If controller 30 requires a suspend of the read data transfer (decision 51 is YES), it issues a suspend request in process 52. In this exemplary implementation, this request is made by controller 30 asserting an active high level on address latch enable signal ALE during the read transfer operation. FIG. 6b illustrates such a suspend operation, occurring during a read data transfer in the advanced mode (i.e., after the mode has been invoked and the data transfer has begun). In the example of FIG. 6b, controller 30 requests the data transfer suspend by asserting address latch enable signal ALE during the data transfer from flash memory device 10 to controller 30. In response. flash memory device 10 suspends read enable signal RE_ (either when at a low level as shown, or at a high level), and thus delays the issuing of a next data word after read enable signal RE_ is suspended. Given the rapid switching rate of read enable signal RE_ and input/output lines I/O1 through I/On in this advanced mode, it is contemplated that one or two additional data words, and the corresponding edges of read enable signal RE_, may be driven by flash memory device 10 after address latch enable signal ALE is driven active high to request the suspend. In this example, controller 30 has asserted address latch enable signal ALE during output data word $D_{out}(4)$, and flash memory device 10 responds by holding further transitions of read enable signal RE_ and of input/output lines I/O1 through I/On during output data word $D_{out}(6)$.

This suspension of further data transfer continues until controller 30 executes process 54 to inactivate address latch enable signal ALE, thus ending the suspend. As shown in FIG. 6b, the suspend state is ended upon controller 30 taking address latch enable signal ALE to an inactive low state. According to this embodiment of the invention, this transition of address latch enable signal ALE serves as the read data strobe for the next output data word from flash memory device 10, namely data word $D_{out}(7)$ in this example. After this initial post-suspend data word, flash memory device 10 again generates the read strobe signal by asserting transitions of read enable signal RE_ as shown. The next transition of read enable signal RE_, in this example, is the strobe for the second output data word $D_{out}(8)$ following the end of the suspend period. The advanced mode read data transfer continues, in process 56, as shown in FIG. 6b.

Referring back to FIG. 5a, the advanced mode read data transfer continues until such time as controller 30 wishes to terminate the transfer, which it indicates to flash memory device 10 in processes 58, 59. Typically, this transfer will be terminated upon controller 30 determining that the end of a page within flash memory device 10 is being reached, although the transfer may also be terminated by controller 30 for other reasons (e.g., upon receiving all of the desired data for the operation).

Figure 6C:
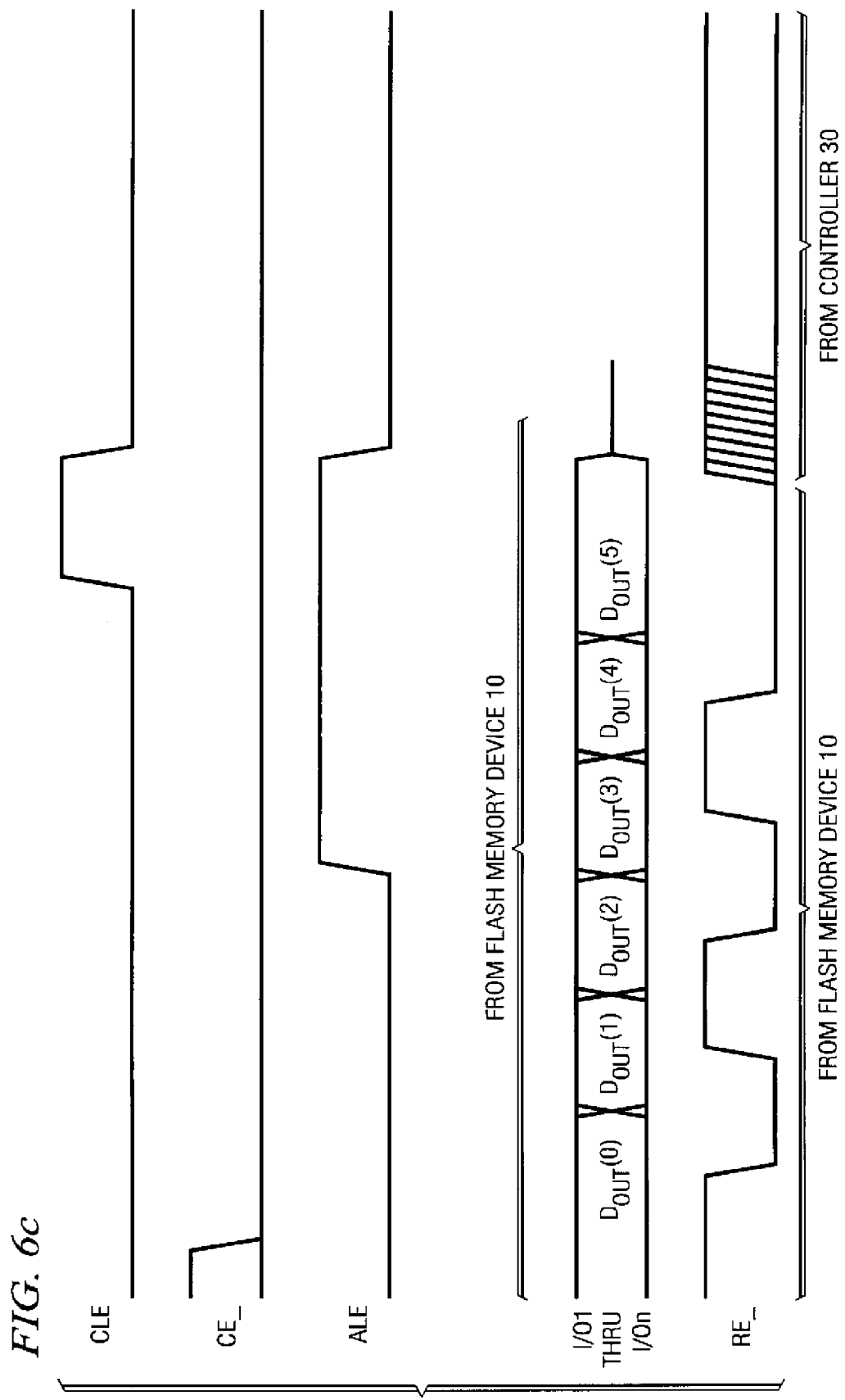

According to this example, to terminate this data transfer, controller 30 first issues a suspend in process 58, for example by asserting an active high level of address latch enable signal ALE as described above. FIG. 6c illustrates this example of the termination processes 58, 59, within which is shown the transition of address latch enable signal ALE during the advanced read data transfer operation. This suspend operation of process 58 is transformed into termination of the advanced read data transfer by controller 30 performing process 59 during the suspend operation. Alternatively, process 59 may be performed after flash memory device 10 itself determines that its output data has reached the end of a page, in which case flash memory device 10 itself maintains read enable signal RE_ at its last level, and maintains the current (i.e., last) output data word on input/output lines I/O1 through I/On; in this case, address latch enable signal ALE will remain inactive low. In the example shown in FIG. 6c, this data transfer is terminated by controller 30 asserting an active high level on command latch enable signal CLE while address latch enable signal ALE is active high. In response to this transition of command latch enable signal CLE, flash memory device 10 controls its output drivers to place input/output lines I/O1 through I/On into a high impedance state, and also releases its control of the conductor corresponding to read enable signal RE_, in both cases permitting controller 30 to take control of these lines when appropriate, while avoiding data contention issues. As shown in the example of FIG. 6c, because the suspend and terminate operations occurred with read enable signal RE_ at a low level, controller 30 will drive an inactive high level on the corresponding line once it takes control of the read enable signal RE_, causing a transition as shown; if the suspend and terminate operations occurred with read enable signal RE_ already at a high level, there would of course be no transition on this line.

Flash memory device 10 then returns to the normal operating mode ("legacy" mode), passing control back to process 44 in the flow diagram of FIG. 5a. A new advanced mode read data transfer will require another instance of initiate process 48, according to this preferred embodiment of the invention.

Further in the alternative, an unconditional termination will occur if controller 30 de-asserts chip enable signal CE_. However, it is contemplated that this uncontrolled termination could result in "glitches" and other spurious and unspecified events both internally to and externally from flash memory device 10 and controller 30.

According to this preferred embodiment of the invention, an advanced, high performance, mode is also provided for the transfer of data from controller 30 to flash memory device 10, in other words for write data transfer operations.

Figure 6D:
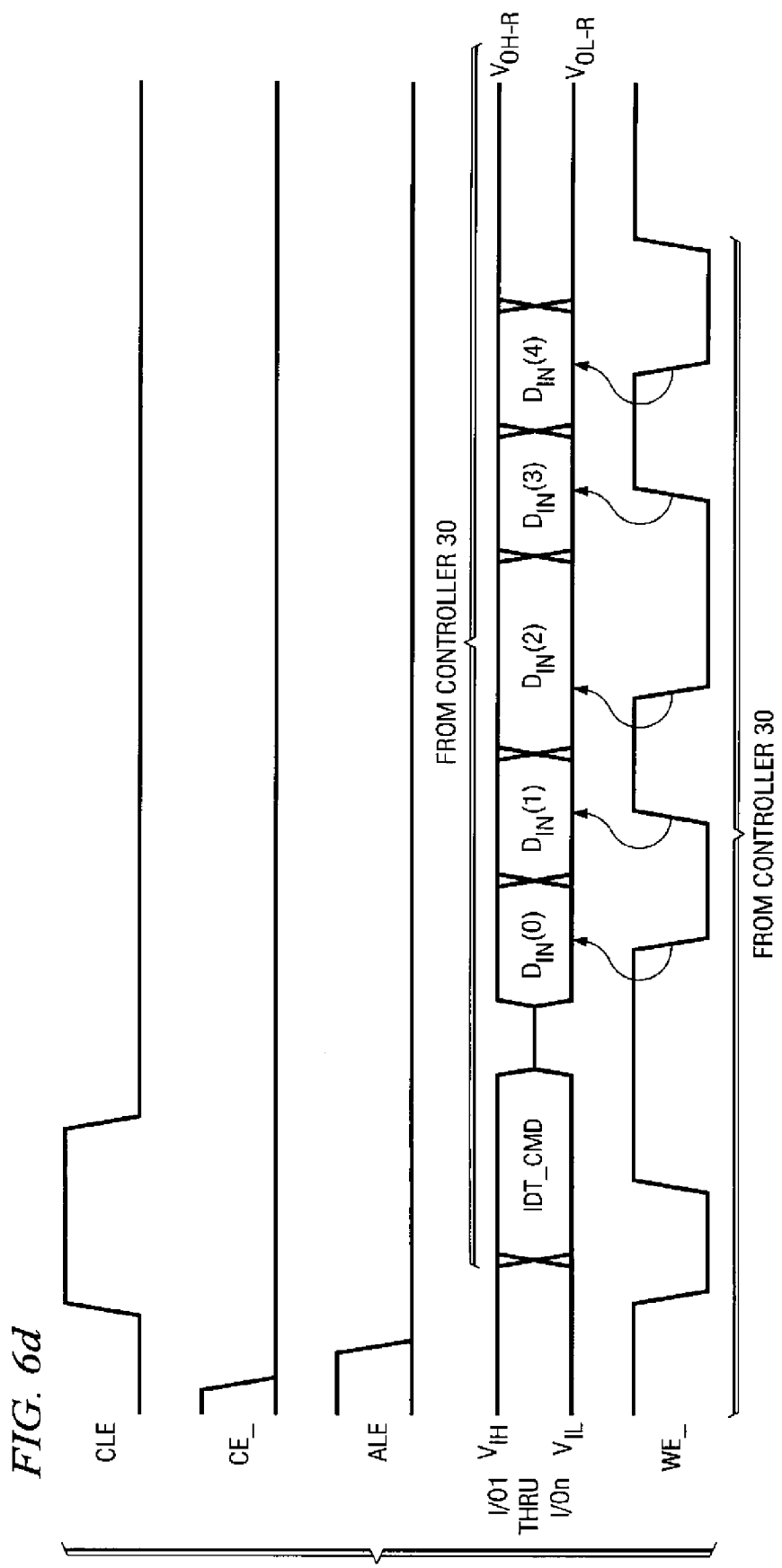
Figure 6E:
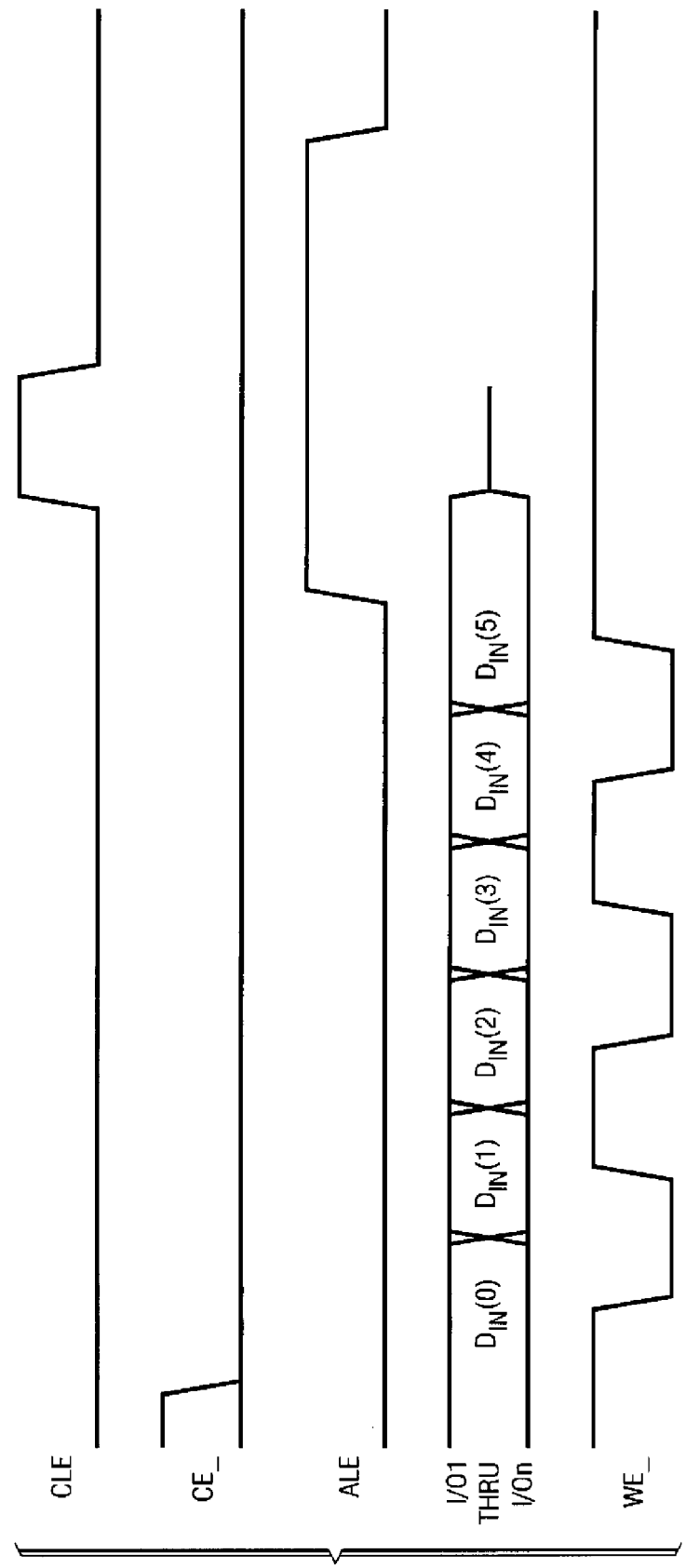

The flow diagram of FIG. 5b, together with the timing diagrams of FIGS. 6a and 6d through 6e, illustrate this operation, as will now be described.

To effect the advanced mode write data transfer, flash memory device 10 begins from the normal operating mode, as entered in process 60. As in the case of the read data transfer, normal mode operations (if any) may first be carried out, in process 62. In process 64, controller 30 issues an address value to flash memory device 10, in this normal operating mode as described above relative to FIG. 4b. And in process 66, controller 66 initiates the advanced data transfer mode in similar fashion as performed for the advanced read data transfer described above relative to FIG. 6a. It is contemplated that the write data transfer in this advanced mode will be executed, through process 66, substantially identically as was the read data transfer. As such, it is contemplated, for example, that the command value IDT_CMD issued in process 66 is the same for both the read and write data transfer operations. Alternatively, separate command values may be assigned for the two operations, relative to one another.

In process 68, controller 30 and flash memory device 10 carry out the advanced write data transfer. FIG. 6d illustrates the timing of signals in an example of this operation, including process 66 in which the combination of command value IDT_CMD, an active high level for command latch enable CLE, and an active low pulse for write enable signal WE_ are issued by controller 30 to flash memory device 10, thus initiating the advanced mode data transfer. As in the previous example, address latch enable signal ALE is maintained at an inactive low level, and chip enable signal CE_ is maintained active low. And because this operation will be a data write, read enable signal RE_ (not shown in FIG. 6d) will be held inactive high by controller 30 throughout. Because write data transfer process 68 remains under the full control of controller 30, in this embodiment of the invention, the latency between the issuing of the command IDT_CMD and the beginning of the write data transfer can be much shorter than that prior to the first output data word in the read data transfer (FIG. 6a). Preferably, a specified time elapses between the rising edge of the pulse of write enable signal WE_ corresponding to the initiation command IDT_CMD, and the falling edge of the first pulse of write enable signal WE_ corresponding to the first input data word $D_{in}(0)$ as shown.

Once the write data transfer begins, in this preferred embodiment of the invention, both the falling and rising edges of write enable signal WE_ serve as write data strobes, asserted by controller 30. As shown in FIG. 6d, this permits controller 30 to issue a new valid write data word $D_{in}(k)$ onto input/output lines I/O1 through I/On synchronously with each edge of write enable signal WE_. As a result, the write data transfer rate in this advanced mode can approach twice the data rate of a normal operating mode write operation, for the same write enable signal WE_ frequency.

According to this embodiment of the invention, referring back to FIG. 5b, suspend decision 69 is also performed throughout the advanced mode write data transfer. Typically, the need for a write suspend is determined solely by controller 30, it being contemplated that flash memory device 10 can receive input data at this data rate without buffer overflow, etc. If no suspend is necessary (decision 69 is NO), the data transfer continues in process 72. If controller 30 requires it (decision 69 is YES), the suspend of the write data transfer is effected in process 70. In this example, suspend process 70 is effected simply by controller 30 extending the state of write enable signal WE_ as long as necessary. This suspension may be performed in either state (write enable signal WE_ held high or held low); FIG. 6d illustrates suspend process 70 during the duration of write data word $D_{in}(2)$, in which write enable signal WE_ is held low. Of course, controller 30 does not issue additional write data words $D_{in}(k)$ during suspend process 70. The end of the suspend period is effected merely by controller 30 driving a transition of write enable signal WE_, together with the next valid write data word $D_{in}(3)$ in the example shown in FIG. 6d, to continue the write data transfer (process 72).

And, as in the read data transfer case, the voltage levels of the data and control signals (input/output lines I/O1 through I/On, and the line for write enable signal WE_) are preferably at a lower voltage level than the conventional levels, for example with a 1.8 volt "swing" between the high and low logic levels. As discussed above in detail, this lower voltage bus will maintain the power consumed by this advanced write data transfer mode at or below that consumed in conventional flash memory systems operating in the normal operating mode, at half the data rate.

Referring back to FIG. 5b in combination with FIG. 6e, termination of the write data transfer is effected in the identical manner as the termination of the read data transfer. In process 74, controller 30 asserts address latch enable signal ALE to an active high level in process 74 to suspend the transfer, and then asserts command latch enable signal CLE to an active high level (while maintaining address latch enable signal ALE high) in process 76, which then terminates the write data transfer. FIG. 6e illustrates the timing of the various signals in terminating a write data transfer. Write enable signal WE_ is either held at a high level as shown in FIG. 6e, or taken to a high level from a low level after the last data word $D_{in}(5)$ (in this example) has been latched. Following termination of the advanced mode write data transfer, effected by holding the high levels at address and command latch enable signals ALE, CLE, respectively, for a specified pulse width, the normal operating mode of flash memory device 10 and controller 30 is then again entered.

In this example, the normal operating mode is effectively a "default" operating mode, considering that the execution of a command is required to invoke the advanced mode, and considering that the operation of flash memory device 10 returns to the normal operating mode at the termination of the data transfer (i.e., without requiring execution of a command). Alternatively, flash memory device 10 may be configured so that execution of a command is required to enter both the advanced data transfer mode and the normal operating mode, such that once flash memory device 10 is in the advanced data transfer mode, it will remain in that mode until a command to return to the normal operating mode is issued by controller 30 and executed by flash memory device 10. Of course, such an approach involves additional overhead in the nature of command sequences.

Further in the alternative, it is contemplated that the "default" operating mode of flash memory device 10 may be the advanced data transfer mode, such that all data transfers are performed in the advanced mode unless a command is issued by controller 30 to place flash memory device 10 into the normal operating mode. According to this alternative embodiment of the invention, once flash memory device 10 is in the normal operating mode, completion of the data transfer will result in flash memory device 10 returning to the advanced data transfer mode.

Figure 7:
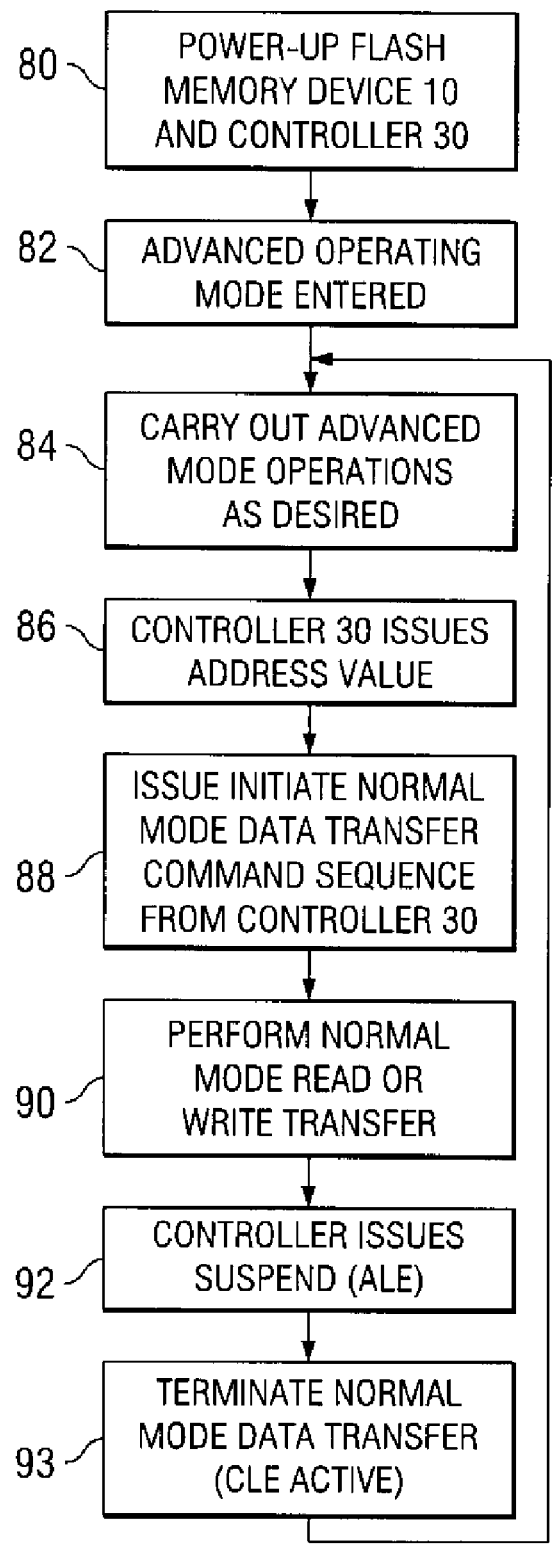
FIG. 7 is a flow diagram illustrating the operation of advanced mode data transfers according to a second preferred embodiment of the invention.

FIG. 7 illustrates the operation of flash memory device 10 according to this alternative preferred embodiment of the invention, in which the advanced data transfer mode is effectively a "default" mode. In process 80, flash memory device 10 and controller 30 are powered-up, or otherwise complete a reset operation, and enter the advanced operating mode in process 82, effectively as a default condition, without requiring issuance or execution of a command. In process 84, read and write operations are carried out in the advanced data transfer operating mode, effectively as described above relative to FIGS. 6b through 6d. In this advanced mode, it is contemplated that suspend operations and the like may be carried out as described above relative to FIG. 6c, for example; it is further contemplated that other operations, such as address, command, and status communication operations, may still follow the normal operating mode approach if desired.

In process 86, flash memory card 25 according to this preferred embodiment of the invention prepares for a normal, or "legacy", data transfer by controller 30 issuing an address value to flash memory device 10, indicating the memory location at which the normal operating mode transfer is to begin. In process 88, controller 30 issues a command sequence to initiate the normal operating mode; it is contemplated that this command sequence will substantially correspond to that described above relative to FIG. 6a, with the command sequence itself preferably operating according to the normal operating mode (contemplated that the command code value is a single byte value). In response to command 88, flash memory device 10 performs a normal operating mode read or write data transfer operation, for example as described above relative to FIGS. 4c and 4d, depending upon the direction of the data transfer. In this embodiment of the invention, controller 30 preferably issues both the read data strobe and the write data strobe clock signals, as described above.

And, according to this alternative preferred embodiment of the invention, the normal operating mode is exited upon completion of the data transfer. In the example of FIG. 7, similarly as described above relative to FIGS. 5a and 5b, termination of the data transfer by controller 30 issuing a suspend signal (e.g., an active level on the address latch enable signal) in process 92, followed by controller 30 terminating the transfer in process 93 (e.g., by issuing an active level of the command latch enable signal). Upon termination of the normal operating mode data transfer according to this preferred embodiment of the invention, control returns to process 84, in which the advanced data transfer mode is again entered, and read and write data transfer operations carried out as desired in process 84.

It is contemplated that other alternative approaches to entry and exiting the various operating modes of flash memory device 10, beyond this alternative preferred embodiment of the invention, will be apparent to those skilled in the art having reference to this specification, and also that these and such other alternative implementations are within the scope of this invention as claimed.

Referring now to FIGS. 8a through 8e, the timing of signals between flash memory device 10 and controller 30 in the context of flash memory card 25, according to a second preferred embodiment of the invention will now be described in detail. The overall processes of entry into, exit from, and operation during the advanced mode according to this second preferred embodiment of the invention preferably follow the processes described above relative to FIG. 5a for a read operation, and to FIG. 5b for a write operation. As such, a detailed description of those processes will not be repeated here in connection with FIGS. 8a through 8e.

As described above relative to the first preferred embodiment of the invention, flash memory device 10 and controller 30 are in the normal operating ("legacy") mode following power-up. As such, read and write operations (if any) in this normal mode are carried out as desired by the user. Entry into the advanced operating mode for a read operation is then performed by controller 30 issuing a memory address value, corresponding to the initial memory address from which data will be read in this advanced operating mode, to flash memory device 10 in the normal operating mode. As before, this memory address is placed on input/output lines I/O1 through I/On in combination with an active level on the address latch enable signal. ALE.

Figure 8A:
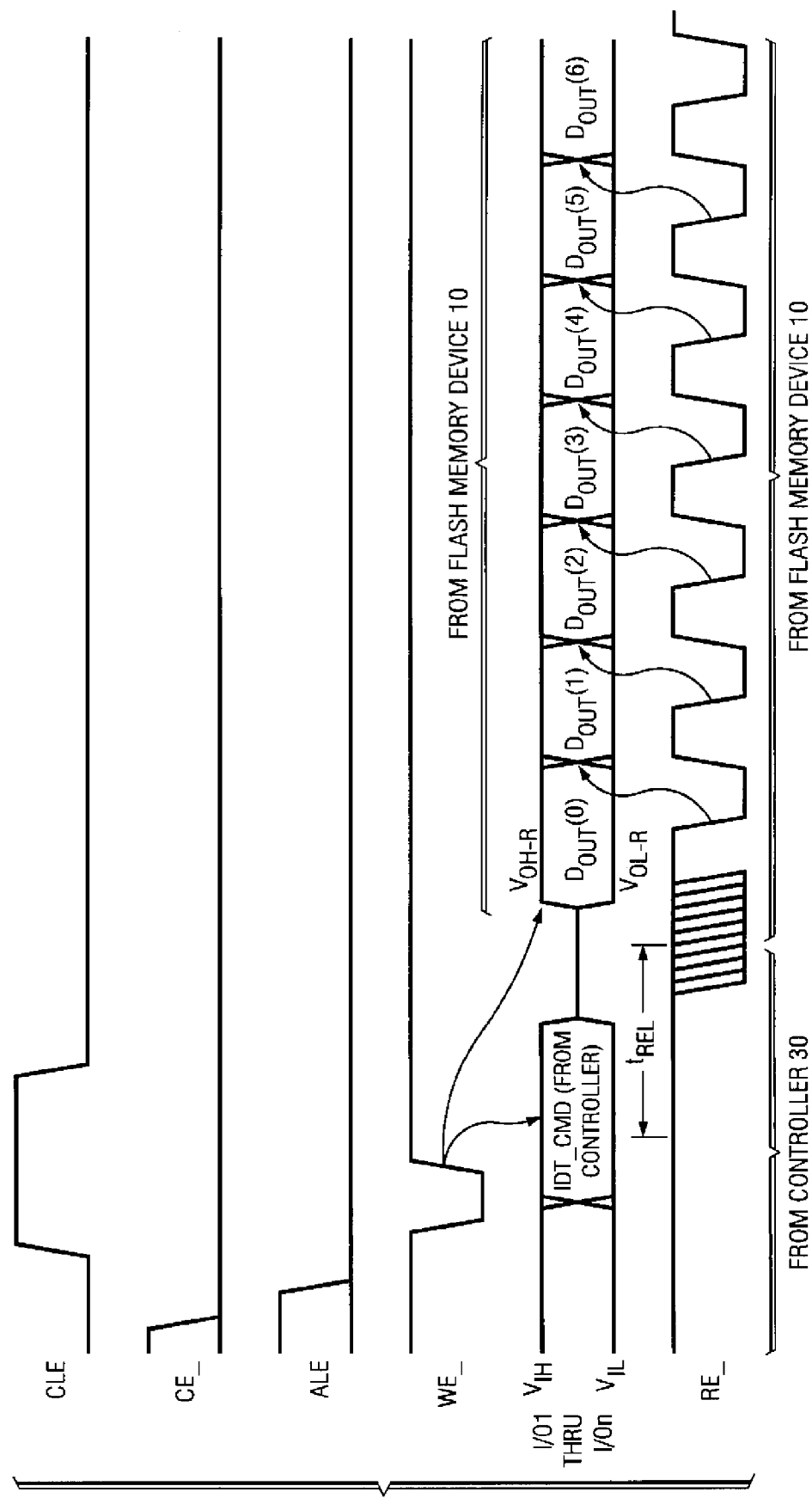
FIGS. 8a through 8e are timing diagrams illustrating signals involved in the operations of FIGS. 5a and 5b according to a second preferred embodiment of the invention.

After the memory address is communicated, controller 30 issues an "initiate data transfer", or "IDT", command sequence to flash memory device 10 as before, by chip enable signal CE_ active low, address latch enable signal ALE inactive low, and command latch enable signal CLE active high. FIG. 8a illustrates this operation. The rising edge of an active low pulse of write enable signal WE_ serves as the data strobe for the IDT command value IDT_CMD (which is a binary word having a value different from other assigned command values) driven onto input/output lines I/O1 through I/On by controller 30. After a specified time following write enable signal WE_ being taken high, controller 30 places input/output lines I/O1 through I/On into a high-impedance state.

According to this second preferred embodiment of the invention, flash memory device 10 will take control of, and drive, the read enable strobe signal RE_. Accordingly, as shown in FIG. 8a, upon time $t_{rel}$ elapsing after the rising edge of the write enable signal WE_ that strobes the IDT command, controller 30 releases control of its read enable signal RE_. Control logic 18 of flash memory device 10 can then drive the state of corresponding line RE_ without contending with controller 30. Flash memory device 10 then begins performing the high-speed, advanced mode, read data transfer. According to this second preferred embodiment of the invention, as shown in FIG. 8a, flash memory device 10 presents the data from the addressed memory cells at a higher data rate than in the legacy mode, in combination with a higher frequency read enable signal RE_ than is available in the legacy mode.

For example, flash memory device 10 may present the output data at input/output lines I/O in this advanced mode at twice the frequency at which data is presented in the legacy mode, in combination with its driving of the read enable signal RE_ at twice the frequency of that signal in the legacy mode. For the example in which the maximum available data rate and read strobe frequency in the legacy mode is 25 MHz, the advanced mode data rate and the frequency of read enable signal RE_ can be as high as 50 MHz. Because flash memory device 10 is itself sourcing read enable signal RE_ and also the data words, the frequencies with which these signals are produced by flash memory device 10 is not under the direct control of controller 30.

FIG. 8a illustrates this advanced mode read operation. The read data transfer process begins with flash memory device 10 issuing the first valid output data word $D_{out}(0)$, following the elapse of a non-zero access time after the rising edge of write enable signal WE_. After the first output data word $D_{out}(0)$, flash memory device 10 then begins issuing active pulses of read enable signal RE_, synchronous with additional output data words $D_{out}(1)$ et seq. According to this preferred embodiment of the invention, one data word $D_{out}(k)$ is issued synchronously with each full cycle of the read enable signal RE_. In the example of FIG. 8a, the falling edge of read enable signal RE_ is the signal edge with which the data words are synchronous; of course, the rising edge of read enable signal RE_ (i.e., read enable signal "RE") may instead be the operative edge. As shown in FIG. 8a, each output data word $D_{out}(k)$ follows its corresponding falling edge of read enable signal RE_ by a non-zero access time. Alternatively, each falling edge of read enable signal RE_ may be issued (or delayed to be issued) to controller 30 within its corresponding valid data word $D_{out}(k)$.

According to this second preferred embodiment of the invention, therefore, the rate at which flash memory device 10 presents data to controller 30 via input/output lines I/O1 through I/On, in this advanced mode, is substantially faster than the data rate in the normal operating mode (FIG. 4d), approaching twice the data rate in typical realizations. This higher data rate is in part enabled by permitting flash memory device 10 to issue the read data strobe edges of read enable signal RE_, which eliminates the propagation delay and necessary timing windows that would be involved if controller 30 were issuing these read data strobe edges. In addition, as described above in connection with the first preferred embodiment of the invention, this increased data rate at input/output lines I/O1 through I/On is attained without dramatically increasing the power consumption of flash memory device 10 and controller 30, by using a reduced voltage swing of the data signal (and of read enable signal RE_, if desired). As described above, the nominal voltage swing of these lines is substantially reduced from this conventional 3.3v bus level, for example to a nominal voltage swing at about 1.80 volts.

For the example of a sixteen-bit input/output bus interface between flash memory device 10 and controller 30 (i.e., there are sixteen input/output lines I/O1 through I/O16), this second preferred embodiment of the invention involves only slightly more power consumption than that of the first preferred embodiment of the invention. As described above, at data rate of 50 MHz, the charging frequency for input/output lines I/O1 through I/On will be 25 MHz according to this preferred embodiment of the invention. The current $I_k$ consumed for a single input/output line I/Ok can thus be calculated:

$$I_k = 25 * 0.065(1.8) = 2.925 \text{ mA}$$

using the typical 1.8 volt swing between the high and low data levels. However, because read enable signal RE_ is operating at twice the frequency as in the normal operating mode and in the first preferred embodiment of the invention, and as such its current consumption will be twice that of a single input/output line I/Ok:

$$I_{RE} = 50 * 0.065(1.8) = 2 * 2.925 \text{ mA} = 5.850 \text{ mA}$$

Accordingly, the overall current consumed in the advanced operating mode for this example, for the case of sixteen input/output lines I/O1 through I/O16, will therefore be:

$$I_{total} = 16(2.925) + 5.850 = 52.65 \text{ mA}$$

which is slightly more than what would be consumed according to the first preferred embodiment of the invention (i.e., 49.73 mA). The current consumed for conventional data transfer, for the case of a sixteen-bit I/O bus, would be, following the description above:

$$I_{total} = 16(2.681) + 2(2.681) = 48.62 \text{ mA}$$

which is slightly lower than the 52.65 mA according to this second preferred embodiment of the invention. However, even though the current consumed according to this embodiment of the invention is slightly higher than the conventional implementation, this current level is attained at a lower voltage swing (1.8 volts versus 3.3 volts) for the input/output signals. As a result, the power consumed in this advanced operating mode is substantially lower than that consumed in conventional flash memory cards. According to these examples, the power consumed in a conventional sixteen I/O flash memory in the normal operating mode will be about 160 mW (3.3 volts times 48.62 mA), while the power consumed by the example of the preferred embodiment of the invention described above will be about 95 mW (1.8 volts times 52.65 mA). This substantial reduction in power consumption is attained in combination with a substantial improvement in data transfer rate, approaching doubling of the data rate for large bursts.

Figure 8B:
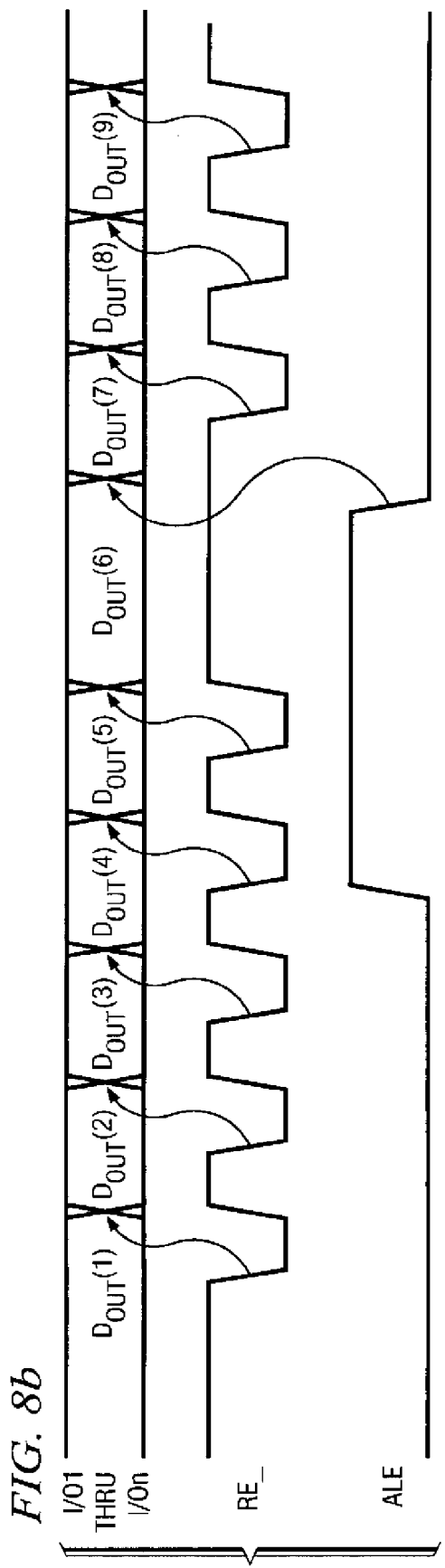

As before, controller 30 may issue a suspend request to flash memory device 10, for example if its input buffer (from flash memory device 10) fills. The operation of flash memory device 10 in response to such a suspend request is shown in FIG. 8b. The suspend request is made by controller 30 asserting an active high level on address latch enable signal ALE during a high-speed read transfer. In response to this request, flash memory device 10 suspends read enable signal RE_ (either when at a high level as shown, or at a low level), delaying the next cycle of read enable signal RE_. Because of the high data rate transfer, one or two additional data words, and the corresponding cycles of read enable signal RE_, may already be in the output "pipeline" of flash memory device 10, so that these corresponding data words may be output before flash memory device 10 reacts to the suspend request. In this example, controller 30 has asserted address latch enable signal ALE during output data word $D_{out}(4)$, and flash memory device 10 responds by holding further cycles of read enable signal RE_ and transitions at input/output lines I/O1 through I/On during output data word $D_{out}(6)$.

Figure 8C:
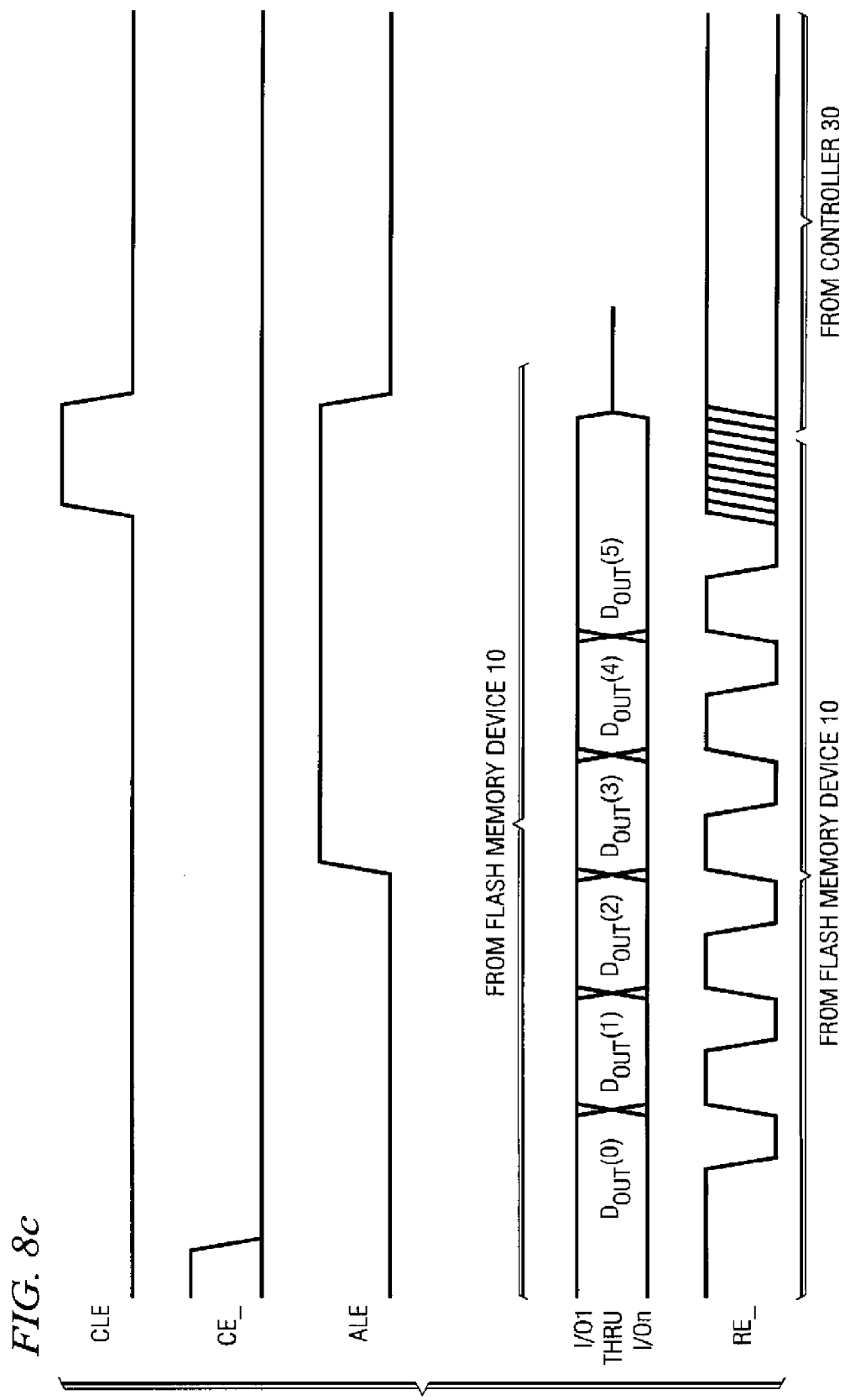

FIG. 8c illustrates the termination of the advanced mode, high-speed read data transfer according to this preferred embodiment of the invention. As before, controller 30 terminates the high-speed data transfer by first issuing a suspend request by asserting an active high level of address latch enable signal ALE. During the suspend request, controller 30 terminates the data transfer operation by asserting an active high level on command latch enable signal CLE while address latch enable signal ALE is active high. In response, flash memory device 10 causes its output drivers to place input/output lines I/O1 through I/On into a high impedance state, and also releases its control of the conductor corresponding to read enable signal RE_. Controller 30 may now take control of these lines if appropriate for the next operation.

Figure 8D:
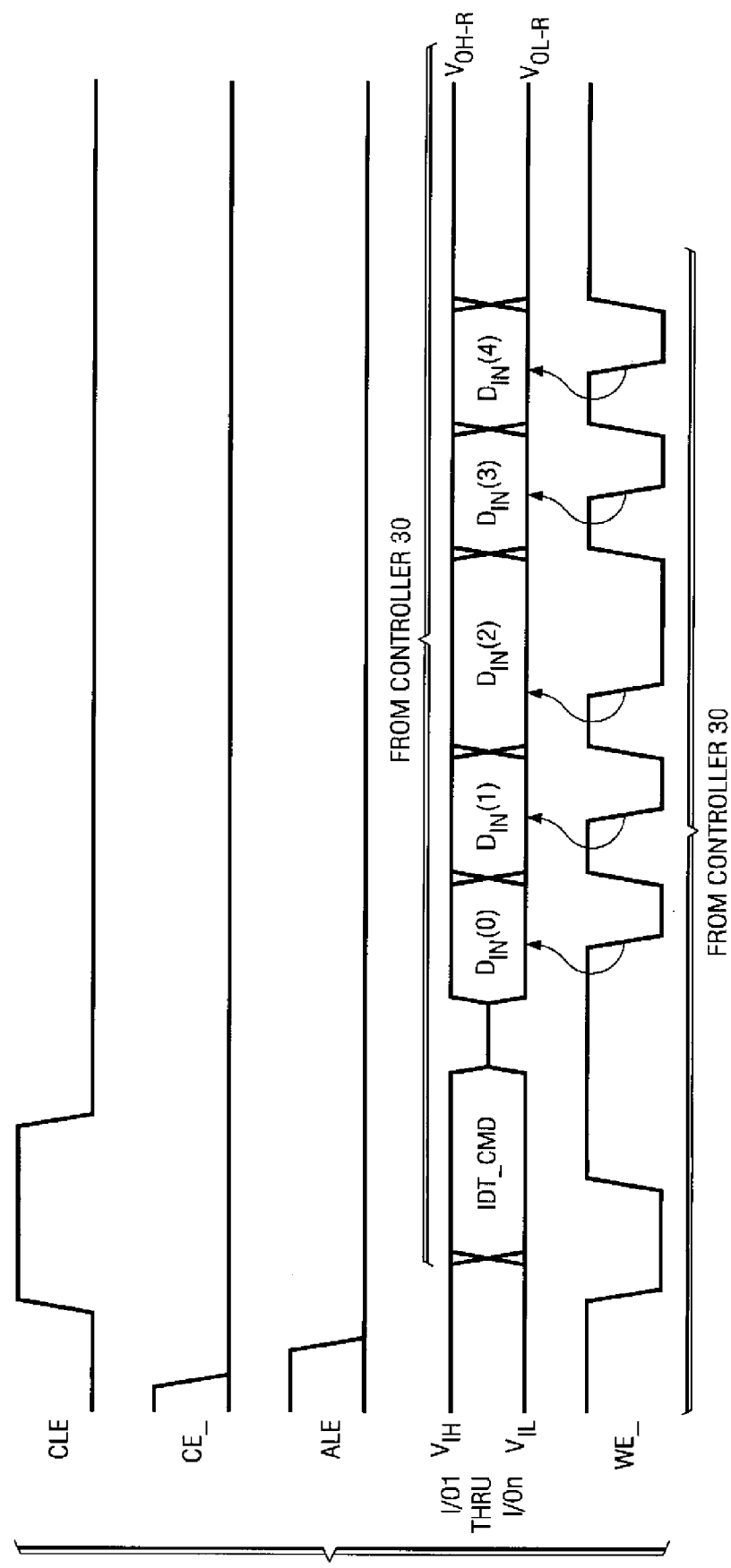

Write operations in the advanced mode, according to this second preferred embodiment of the invention, will now be described relative to FIGS. 8d and 8e. As in the case of the read data transfer, the advanced mode is entered after flash memory device 10 and controller 30 have operated in the normal, or legacy, mode. Entry into the advanced data transfer mode for a write operation is performed similarly as for the advanced read data transfer described above relative to FIG. 8a. As shown in FIG. 8d, the advanced mode command value IDT_CMD is issued by controller 30 in combination with an active high level for command latch enable CLE, and an active low pulse for write enable signal WE_. As before, address latch enable signal ALE is maintained at an inactive low level, and chip enable signal CE_ is maintained active low. The data write operation for this entry into the advanced mode is indicated by controller 30 maintaining read enable signal RE_ (not shown in FIG. 8d)

inactive high throughout the write operation. A specified time is then permitted to elapse between the rising edge of the pulse of write enable signal WE_ with the initiation command IDT_CMD, and the falling edge of the first pulse of write enable signal WE_ corresponding to the first input data word $D_{in}(0)$.

During this advanced mode write data transfer, according to this second preferred embodiment of the invention, the frequency of cycles of write enable signal WE_ is increased, for example to twice the frequency of that used in writes in the normal mode. Falling edges of write enable signal WE_ serve as write data strobes in this example. And also, in this advanced mode as well as in the normal mode, write enable signal WE_ is asserted by controller 30, in combination with the data values driven by controller 30 on input/output lines I/O1 through I/On. As shown in FIG. 8d, controller 30 issues a new valid write data word $D_{in}(k)$ onto input/output lines I/O1 through I/On synchronously with each falling edge of write enable signal WE_. Because the frequency of write enable signal WE_ is doubled, in this example, the write data transfer rate in this advanced mode can approach twice the data rate of a normal operating mode write operation. For example, if the maximum write data transfer rate, and write enable signal frequency, is 25 MHz in the normal mode, the data transfer rate and write enable signal frequency may be increased to as high as 50 MHz in the advanced mode according to this second preferred embodiment of the invention. Flash memory device 10 is constructed, according to this embodiment of the invention, so that it can receive and process data at that higher rate. Of course, controller 30 may use an actual write enable signal frequency and data rate at a frequency lower than the maximum (e.g., 50 MHz), depending on the system application and the rate at which controller 30 is itself processing data.

Also according to this embodiment of the invention, a suspend may be inserted into the advanced mode write data transfer. In this example, as before, controller 30 suspends the write data transfer simply by extending the state of write enable signal WE_ as long as necessary, as shown in FIG. 8d. This suspension may be performed in either state (write enable signal WE_ held high or held low). New data words $D_{in}(k)$ are not issued, of course, during this suspend period. The suspend period is ended by controller 30 driving the next cycle of write enable signal WE_, together with the next valid write data word $D_{in}(3)$ in the example shown in FIG. 8d, to continue the write data transfer.

And, as in the read data transfer case, the voltage levels of the data and control signals (input/output lines I/O1 through I/On, and the line for write enable signal WE_) are preferably at a lower voltage level than the conventional levels, for example with a 1.8 volt "swing" between the high and low logic levels. As discussed above in detail, this lower voltage bus will maintain the power consumed by this advanced write data transfer mode at or below that consumed in conventional flash memory systems operating in the normal operating mode, at half the data rate.

Figure 8E:
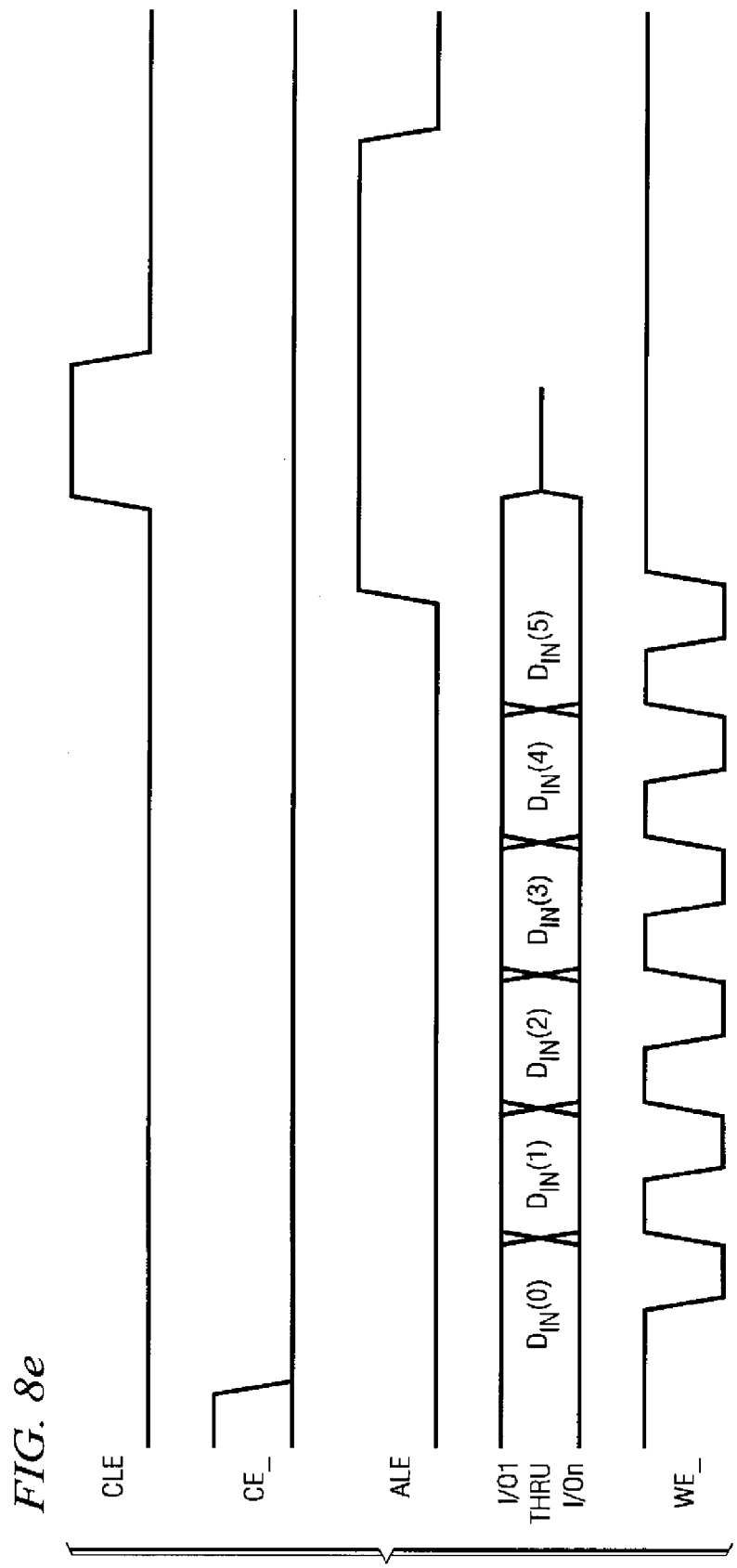

Referring now to FIG. 8e, the advanced mode write data transfer is performed identically as the termination of an advanced read data transfer according to this second preferred embodiment of the invention. Termination of the advanced mode is performed by controller 30 driving address latch enable signal ALE to an active high level to suspend the write transfer, during which time controller 30 asserts command latch enable signal CLE to an active high level (while maintaining address latch enable signal ALE high) to terminate the write data transfer. Write enable signal WE_ is either held at or taken to a high level after the last data word $D_{in}(5)$ (in this example) has been latched. Following termination of the advanced mode write data transfer, effected by holding the high levels at address and command latch enable signals ALE, CLE, respectively, for a specified pulse width, the normal operating mode of flash memory device 10 and controller 30 is then again entered.

According to this second preferred embodiment of the invention, therefore, the advanced, or high-speed, data transfer mode of operation is carried out in an alternative manner, by permitting the use of higher frequency strobe signals to increase the data rate. It is contemplated that this operation, according to the second preferred embodiment of the invention, may be more compatible with the desired operation in some flash memory applications.

Flash memory device 10, controller 30, and flash memory card 25 according to the preferred embodiments of the invention thus provide important advantages over conventional devices and systems. This invention enables high data transfer rates, approaching double the data rate of conventional devices and systems, while still providing command and signal compatibility with "legacy" devices that do not have the advanced capability. In addition, the lower bus voltage signals involved in the advanced data transfer mode maintain the overall device and system current and power consumption at near, or even below, that of conventional flash memory devices and systems.

As a result, it is contemplated that this invention can especially be beneficial in those digital system applications in which data transfer rates are especially critical. One such application, as discussed above, is in high-performance digital still cameras. In such cameras, the image resolution (and thus the data captured per image) now exceeds 10 megapixels, with up to 12.4 megapixel cameras now available on the market. The data transfer rate from the image sensor to flash memory is critical, however, as this data transfer rate is a direct factor in rate at which images can be captured, commonly experienced as "shutter lag" by the camera user. And because the camera user is concerned primarily with the absolute delay encountered (i.e., independent of the amount of data acquired in each image), as the image resolution increases, this load on the data transfer rate is exacerbated. Another potential application for such high data transfer rates is in the use of solid-state flash memory as mass storage media in computer systems, substantially replacing some or all of the magnetic disk drive mass storage conventionally used. The ability to use solid-state memory, rather than disk drives, is contemplated to enable further miniaturization and portability of computer systems, and also to greatly increase the functionality of modern portable and handheld systems.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A flash memory device, comprising:
   at least one memory array comprised of non-volatile memory cells arranged in rows and columns;
   a data register, for storing data corresponding to stored states of the memory cells in the at least one memory array; and control circuitry, coupled to the data register, coupled to input/output terminals, and coupled to a plurality of control terminals, for receiving data from the input/output terminals and for presenting data to the input/output terminals, and for controlling the operation of the device in a normal operating mode and in an advanced mode, responsive to control signals received at the control terminals;

wherein, in the normal operating mode, the control circuitry presents data words at the input/output terminals responsive to transitions of a selected polarity of a read data strobe signal received at a first one of the plurality of control terminals, the read data strobe signal having a maximum available frequency in the normal operating mode;

wherein, in the advanced operating mode, the control circuitry presents read data strobe signals at the one of the plurality of control terminals, and presents data words at the input/output terminals responsive to transitions of a selected polarity of the read data strobe signal;

and wherein the read data strobe signal in the advanced data transfer mode has a frequency higher than the maximum available frequency in the normal operating mode.

2. The device of claim 1, further comprising:

a command register, coupled to the control circuitry;

wherein the control circuitry stores a command value received at the input/output terminals into the command register responsive to receiving a transition of a write data strobe signal at a second one of the plurality of control terminals.

3. The device of claim 2, wherein the control circuitry enters the advanced operating mode from the normal operating mode responsive to the command value corresponding to initiation of the advanced mode.

4. The device of claim 2, wherein the control circuitry enters the normal operating mode from the advanced operating mode responsive to the command value corresponding to initiation of the normal mode.

5. The device of claim 1, wherein the normal operating mode corresponds to standardized specifications for communications between flash memory devices and controllers, the standardized specifications including a first voltage specification defining high and low logic levels for the read data strobe signal and the data words at the input/output terminals;

and wherein the control circuitry presents data words and the read data strobe signal according to a second specified voltage specification defining a substantially lower voltage for substantially smaller voltage swing than that defined by the high and low logic levels in the first specified voltage specification.

6. The device of claim 5, wherein the voltage swing defined by the high and low logic levels in the first specified voltage specification is nominally about 3.3 volts;

and wherein the voltage swing defined by the high and low logic levels in the secondly specified voltage specification is nominally about 1.8 volts.

7. The device of claim 1, wherein, in the advanced operating mode, the control circuitry latches data words received at the input/output terminals into the data register, responsive to transitions of a selected polarity of a write data strobe signal received at a second one of the plurality of control terminals;

wherein the write data strobe signal has a maximum available frequency in the normal operating mode;

and wherein the write data strobe signal in the advanced data transfer mode has a frequency higher than the maximum available frequency in the normal operating mode.

8. The device of claim 7, wherein, in the normal operating mode, the control circuitry latches data words received at the input/output terminals into the data register, responsive to transitions of a first polarity of the write data strobe signal received at the second one of the plurality of control terminals.

9. The device of claim 1, further comprising:

a command register, coupled to the control circuitry;

wherein the control circuitry stores a command value received at the input/output terminals into the command register responsive to receiving a transition of a write data strobe signal at a second one of the plurality of control terminals in combination with a command latch enable signal received at a third one of the plurality of control terminals;

and wherein the control circuitry enters the advanced operating mode from the normal operating mode responsive to the command value corresponding to initiation of the advanced mode.

10. The device of claim 9, wherein the control circuitry, in the advanced operating mode, holds a current value of a data word at the input/output terminals and a current state of the read enable signal at the first one of the plurality of control terminals responsive to receiving a suspend request signal at one of the plurality of control terminals.

11. The device of claim 10, wherein the control circuitry resumes the presenting of data words to the controller in the advanced data transfer mode and the driving of the read data strobe signal responsive to receiving an end of the suspend request from the controller.

12. The device of claim 11, wherein the control circuitry receives a memory address from the controller over the input/output lines in combination with a transition of a first polarity of a write data strobe signal from the controller, and in combination with receiving an address latch enable signal from the controller;

and wherein the suspend request corresponds to a transition of the address latch enable signal during the presenting of data words to the controller in the advanced data transfer mode.

13. A flash memory subsystem, comprising:

a flash memory controller, having a host interface for interfacing to a host system;

a data bus, coupled to the flash memory controller;

a plurality of control lines, coupled to the flash memory controller;

a flash memory device, coupled to the data bus and the plurality of control lines, and comprising:

at least one memory array comprised of non-volatile memory cells arranged in rows and columns;

a data register, for storing data corresponding to stored states of the memory cells in the at least one memory array; and control circuitry, coupled to the data register, coupled to coupled to the data bus and the plurality of control lines, for receiving data from and presenting data to the data bus, and for controlling the operation of the device in a normal operating mode and in an advanced mode, responsive to control signals received from the control lines;

wherein, in the normal operating mode, the control circuitry presents data words on the data bus responsive to transitions of a selected polarity of a read data strobe signal received from the controller;

wherein, in the advanced operating mode, the control circuitry presents read data strobe signals to the controller, and presents data words on the data bus responsive to transitions of a selected polarity of the read data strobe signal.

wherein the read data strobe signal has a maximum available frequency in the normal operating mode;

and wherein the read data strobe signal in the advanced data transfer mode has a frequency higher than the maximum available frequency in the normal operating mode.

14. The system of claim 13, wherein the flash memory device further comprises:
   a command register, coupled to the control circuitry;
   wherein the control circuitry stores a command value received on the data bus into the command register responsive to receiving a transition of a write data strobe signal from the controller.

15. The system of claim 14, wherein the control circuitry enters the advanced operating mode from the normal operating mode responsive to the command value corresponding to initiation of the advanced mode.

16. The system of claim 14, wherein the control circuitry enters the normal operating mode from the advanced operating mode responsive to the command value corresponding to initiation of the normal mode.

17. The system of claim 13, wherein the normal operating mode corresponds to standardized specifications for communications between flash memory devices and controllers, the standardized specifications including a first voltage specification defining high and low logic levels for the read data strobe signal and the data words;
   and wherein the control circuitry of the flash memory device and the flash memory controller both present data words and the read data strobe signal according to a second specified voltage specification defining a substantially lower voltage for substantially smaller voltage swing than that defined by the high and low logic levels in the first specified voltage specification.

18. The system of claim 17, wherein the voltage swing defined by the high and low logic levels in the first specified voltage specification is nominally about 3.3 volts;
   and wherein the voltage swing defined by the high and low logic levels in the secondly specified voltage specification is nominally about 1.8 volts.

19. The system of claim 13, wherein, in the advanced operating mode, the control circuitry latches data words received on the data bus into the data register, responsive to transitions of a selected polarity of a write data strobe signal received from the flash memory controller;
   wherein the write data strobe signal has a maximum available frequency in the normal operating mode;
   and wherein the write data strobe signal in the advanced data transfer mode has a frequency higher than the maximum available frequency in the normal operating mode.

20. The system of claim 19, wherein, in the normal operating mode, the control circuitry latches data words received on the data bus into the data register, responsive to transitions of a first polarity of the write data strobe signal received from the flash memory controller.

21. The system of claim 13, wherein the flash memory device further comprises:
   a command register, coupled to the control circuitry;
   wherein the control circuitry stores a command value received on the data bus into the command register responsive to receiving a transition of a write data strobe signal and a command latch enable signal from the flash memory controller;
   and wherein the control circuitry enters the advanced operating mode from the normal operating mode responsive to the command value corresponding to initiation of the advanced mode.

22. The system of claim 21, wherein the control circuitry, in the advanced operating mode, holds a current value of a data word on the data bus and a current state of the read enable signal responsive to receiving a suspend request signal from the flash memory controller.

23. The system of claim 22, wherein the control circuitry resumes the presenting of data words to the controller in the advanced data transfer mode and the driving of the read data strobe signal responsive to receiving an end of the suspend request from the controller.

24. The system of claim 22, wherein the control circuitry receives a memory address from the controller over the input/output lines in combination with a transition of a first polarity of a write data strobe signal from the controller, and in combination with receiving an address latch enable signal from the controller;
   and wherein the suspend request corresponds to a transition of the address latch enable signal during the presenting of data words to the controller in the advanced data transfer mode.

* * * * *